(12) United States Patent
Sakamoto et al.

(10) Patent No.: US 11,700,159 B2
(45) Date of Patent: *Jul. 11, 2023

(54) RECEPTION APPARATUS AND RECEPTION METHOD

(71) Applicant: Panasonic Intellectual Property Corporation of America, Torrance, CA (US)

(72) Inventors: Takenori Sakamoto, Kanagawa (JP); Hiroyuki Motozuka, Kanagawa (JP); Masataka Irie, Kanagawa (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/496,533

(22) Filed: Oct. 7, 2021

(65) Prior Publication Data

US 2022/0030663 A1 Jan. 27, 2022

Related U.S. Application Data

(63) Continuation of application No. 16/896,719, filed on Jun. 9, 2020, now Pat. No. 11,172,538, which is a (Continued)

(30) Foreign Application Priority Data

Sep. 1, 2016 (JP) .................................. 2016-171216

(51) Int. Cl.
*H04L 27/26* (2006.01)
*H03M 13/11* (2006.01)
(Continued)

(52) U.S. Cl.
CPC ..... *H04L 27/2602* (2013.01); *H03M 13/1102* (2013.01); *H04L 1/0003* (2013.01);
(Continued)

(58) Field of Classification Search
CPC .............. H04W 80/08; H04W 72/0466; H04L 27/2602; H04L 27/2605; H04L 1/0003;
(Continued)

(56) References Cited

U.S. PATENT DOCUMENTS 9,413,581 B2 8/2016 Kwon
10,320,529 B2 6/2019 Chun et al.
(Continued)

FOREIGN PATENT DOCUMENTS

WO 2015/102181 7/2015
WO 2016/129201 A1 8/2016
(Continued)

OTHER PUBLICATIONS

Communication pursuant to Article 94(3) EPC, dated Mar. 4, 2022, for European Patent Application No. 20199992.7, 6 pages.
(Continued)

*Primary Examiner* — Lakeram Jangbahadur
(74) *Attorney, Agent, or Firm* — Seed IP Law Group LLP

(57) ABSTRACT

In a transmission device, a signal processing circuit generates an aggregate physical layer convergence protocol data unit (A-PPDU) by adding a guard interval to each of a first part of a first physical layer convergence protocol data unit (PPDU) transmitted over each of a first through L'th channel of a predetermined channel bandwidth, where L is an integer of 2 or greater, a second part of the first PPDU transmitted over each of an (L+1)'th through P'th channel, which is a variable channel bandwidth that is N times the predetermined channel bandwidth, where N is an integer of 2 or greater and P is an integer of L+1 or greater, and a second
(Continued)

PPDU transmitted over the (L+1)'th through P'th channel. A wireless circuit transmits the A-PPDU.

8 Claims, 28 Drawing Sheets

Related U.S. Application Data continuation of application No. 16/277,616, filed on Feb. 15, 2019, now Pat. No. 10,721,793, which is a continuation of application No. PCT/JP2017/030655, filed on Aug. 28, 2017.

(51) Int. Cl.
  *H04L 1/00* (2006.01)
  *H04W 72/044* (2023.01)
  *H04W 80/08* (2009.01)
  *H04L 5/00* (2006.01)

(52) U.S. Cl.
  CPC ...... *H04L 27/2605* (2013.01); *H04L 27/2607* (2013.01); *H04L 27/2628* (2013.01); *H04W 72/0466* (2013.01); *H04W 80/08* (2013.01); *H04L 5/0007* (2013.01); *H04L 27/2603* (2021.01)

(58) Field of Classification Search
  CPC ............. H04L 27/2607; H04L 27/2628; H04L 5/0007; H03M 13/1102
  See application file for complete search history.

(56) References Cited

U.S. PATENT DOCUMENTS

| | | | |
|---|---|---|---|
| 2007/0147284 | A1 | 6/2007 | Sammour et al. |
| 2008/0130538 | A1 | 6/2008 | Raissinia et al. |
| 2015/0146653 | A1 | 5/2015 | Zhang et al. |
| 2016/0119047 | A1 | 4/2016 | Lee |
| 2016/0205565 | A1 | 7/2016 | Liu et al. |
| 2016/0309457 | A1* | 10/2016 | Eitan ................. H04L 1/009 |
| 2017/0280354 | A1* | 9/2017 | Huang ............. H03M 13/1148 |
| 2018/0048509 | A1* | 2/2018 | Huang ................ H04L 1/0057 |
| 2018/0063299 | A1 | 3/2018 | Genossar et al. |
| 2018/0279170 | A1 | 9/2018 | Sakamoto et al. |
| 2019/0182893 | A1 | 6/2019 | Sakamoto et al. |

FOREIGN PATENT DOCUMENTS

| | | |
|---|---|---|
| WO | 2016/194298 A1 | 12/2016 |
| WO | 2018/043368 A1 | 3/2018 |

OTHER PUBLICATIONS

Jang et al., "Samsung MAC Proposal Technical Specification", doc.: IEEE 802.11-03/0918r2, Sep. 2004, 33 pages.
Au, "Task Group AY Jan. 2016 Agenda." Upload date Jan. 21, 2016, IEEE 802.11-15/1472r7, 59 pages.
Cordeiro, "Specification Framework for TGay," Upload date Jun. 13, 2016, IEEE 802.11-15/01358r4, 11 pages.
Cordeiro, "Specification Framework for TGay," Upload date Jan. 26, 2016, IEEE 802.11-15/01358r1, 6 pages.
Cordeiro, "Specification Framework for TGay," Upload date Aug. 16, 2016, IEEE 802.11-15/01358r5, 26 pages.
Hurtarte, "IEEE 802.11 Task Group AY, Jan. 2016 Atlanta Meeting Minutes," Upload date Feb. 4, 2016, IEEE 802.11-16/00234r0, 12 pages.
Sakamoto et al., "Text changes on EDMG A-PPDU format," Upload date Nov. 6, 2017, IEEE 802.11-17/1677r0, 4 pages.
Sakamoto et al., "EDMG SC mode A-PPDU transmission," Upload date Nov. 6, 2017, IEEE P802,11-17/1683r0, 8 pages.
Sakamoto et al., "Text changes on EDMG A-PPDU format," Upload date Nov. 8, 2017, IEEE 802.11-17/1677r1, 4 pages.
English Translation of Russian Federation Office Action, dated Feb. 22, 2022, for the related Russian Federation Patent Application No. 2019137436, 5 pages.
Extended European Search Report dated Jan. 20, 2021, for the corresponding European Patent Application No. 20199992.7, 11 pages.
IEEE Std 802.11ad(TM)-2012, IEEE Standard for Information Technology—Telecommunications and information exchange between systems Local and metropolitan area networks—Specific requirements Part 11: Wireless LAN Medium Access Control (MAC) and Physical Layer (PHY) Specifications Amendment 3: Enhancements for Very High Throughput in the 60 GHz Band, Dec. 28, 2012 (Whole Pages).
IEEE Std 802.11ad(TM)-2012, Information Technology—Telecommunications and information exchange between systems—Local and metropolitan area networks—Specific requirements—Part 11: Wireless LAN Medium access control (MAC) and physical layer (PHY) specifications AMENDMENT 3: Enhancements for very high throughput in the 60 GHz band(adoption of IEEE Std 802.11ad-2012), Dec. 28, 2012, p. 237 (9.13a DMG A-PPDU operation).
IEEE 802.11-16/1011r0, "EDMG Header Encoding and Modulation", Jul. 26, 2016, Internet<URL:https://mentor.ieee.org/802.11/dcn/16/11-16-1011-00-00ay-edmg-header-a-encoding-and-modulation.pptx>.
IEEE 802.11-17/0051r3, "EDMG A-PPDU for 11ay SC mode", Jan. 17, 2017, Internet<URL:https://mentor.ieee.org/802.11/dcn/17/11-17-0051-03-00ay-edmg-a-ppdu-for-11ay-sc-mode.pptx>.
International Search Report of PCT application No. PCT/JP2017/030655 dated Nov. 14, 2017.
Lomayev et al., Intel, "Non-EDMG Part of Preamble for MIMO in 11ay," doc.: IEEE 802.11-16/0988r1, Jul. 25, 2016, 18 pages.

\* cited by examiner

FIG. 2

| NAME OF FIELD | DESCRIPTION |
|---|---|
| Scrambler Initialization | INITIAL SEED OF SCRAMBLER |
| MCS | MODULATION AND ENCODING SCHEME |
| Length | DATA OCTET COUNT OF DATA FIELD |
| Additional PPDU | INDICATES BEING AN A-PPDU WHEN 1 |
| Packet Type | 0: TRN-R, 1: TRN-T |
| Training Length | LENGTH OF TRN-R/T SUBFIELD |
| Aggregation | INDICATES BEING AN A-MPDU WHEN 1 |
| Beam Tracking Request | INDICATES REQUESTING Beam Tracking WHEN 1 |
| Last RSSI | RECEPTION POWER LEVEL OF IMMEDIATELY PRECEDING PACKET |
| Turnaround | TURNAROUND |
| Reserved | RESERVED |
| HCS | HEADER CHECK SEQUENCE |

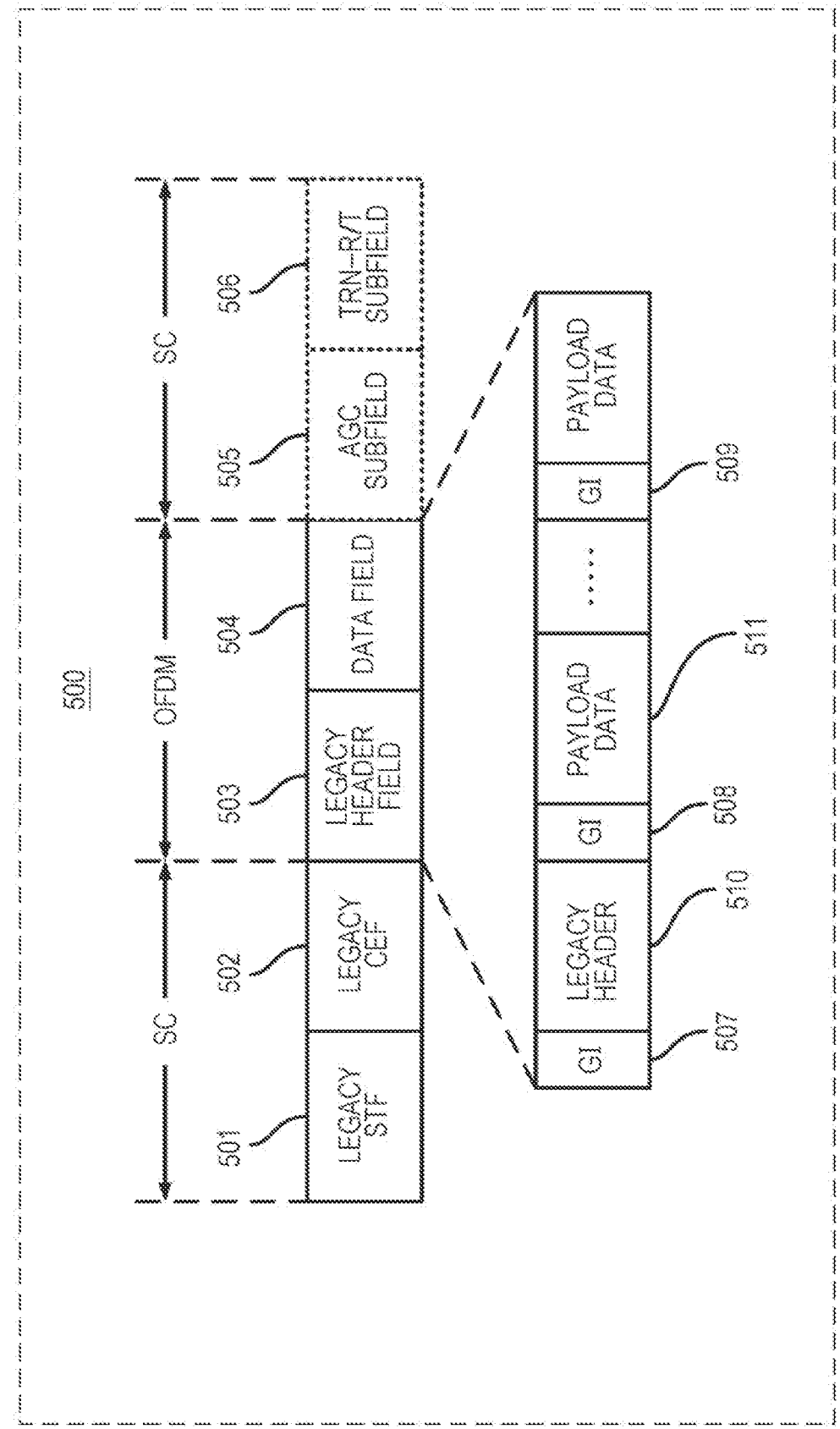

FIG. 6

| NAME OF FIELD | DESCRIPTION |
|---|---|
| Scrambler Initialization | INITIAL SEED OF SCRAMBLER |
| MCS | MODULATION AND ENCODING SCHEME |
| Length | DATA OCTET COUNT OF DATA FIELD |
| Additional PPDU | INDICATES BEING AN A-PPDU WHEN 1 |
| Packet Type | 0: TRN-R, 1: TRN-T |
| Training Length | LENGTH OF TRN-R/T SUBFIELD |
| Aggregation | INDICATES BEING AN A-MPDU WHEN 1 |
| Beam Tracking Request | INDICATES REQUESTING Beam Tracking WHEN 1 |
| Tone Pairing Type | INDICATES BEING Dynamic Tone Pairing WHEN 1 |
| DTP Indicator | INDICATES UPDATE FOR Dynamic Tone Pairing |
| Last RSSI | RECEPTION POWER LEVEL OF IMMEDIATELY PRECEDING PACKET |
| Turnaround | TURNAROUND |
| Reserved | RESERVED |
| HCS | HEADER CHECK SEQUENCE |

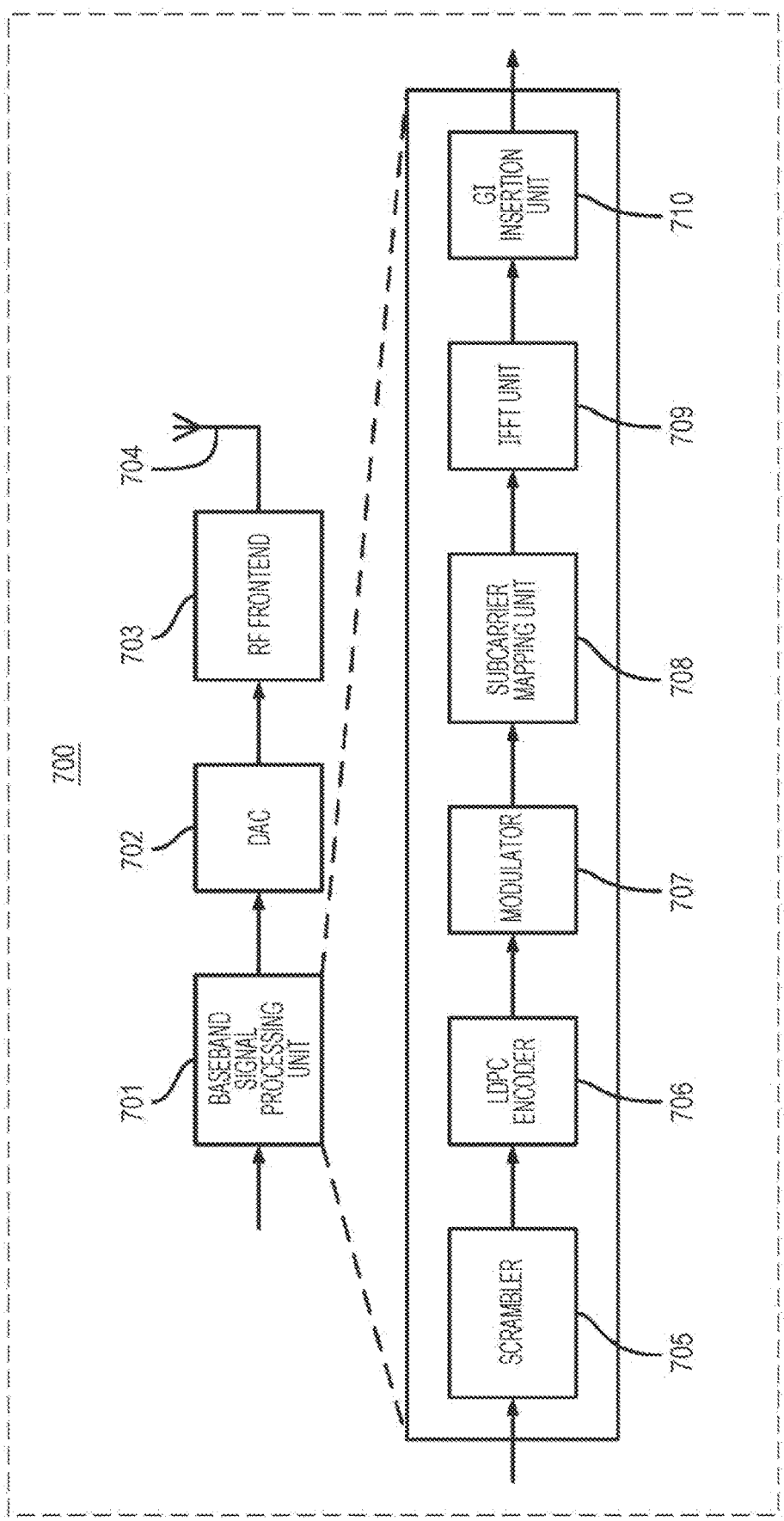

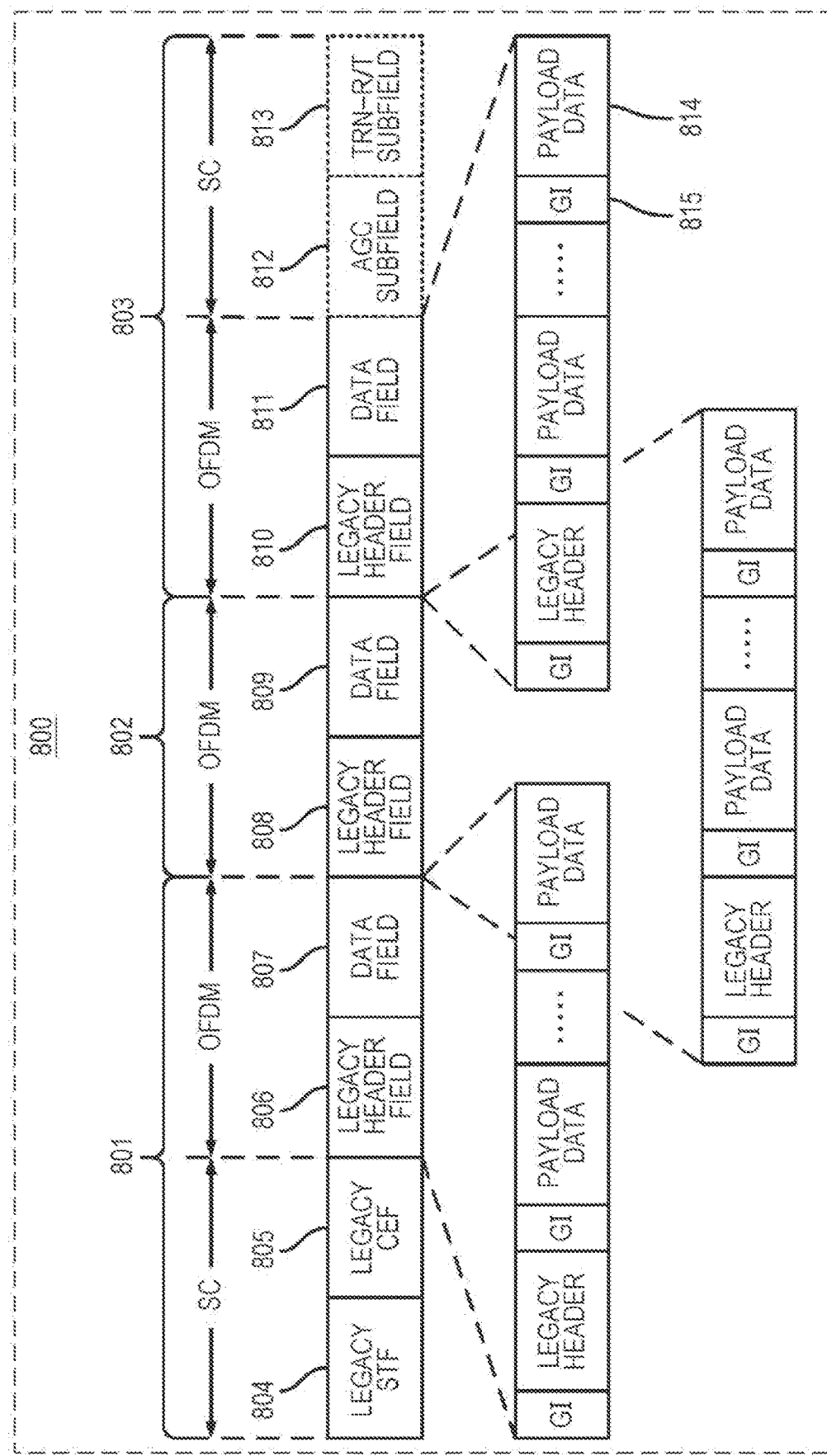

FIG. 10

| NAME OF FIELD | DESCRIPTION |
|---|---|
| BW | BANDWIDTH USED |
| GI Length | INSTRUCTS LENGTH OF GI (SHORT/NORMAL/LONG) |
| NON-LEGACY MCS | MODULATION AND ENCODING SCHEME |
| PSDU Length | DATA OCTET COUNT OF DATA FIELD |
| Additional PPDU | INDICATES BEING AN A-PPDU WHEN 1 |
| Reserved | RESERVED |
| HCS | HEADER CHECK SEQUENCE |

RECEPTION APPARATUS AND RECEPTION METHOD

BACKGROUND

1. Technical Field

The present invention relates to wireless communication, and more specifically relates to a device and method for configuring and transmitting aggregate physical layer convergence protocol data units (PLCP Protocol Data Units (PPDU)) in a wireless communication system.

2. Description of the Related Art

There is increasing interest in millimeter wave networks that use the 60 GHz band, regarding which no license is required. Wireless Hi-Definition (HD) technology is a wireless communication standard that was the first in the industry to use the 60 GHz band, and is capable of wireless streaming transmission of several gigabytes per second of at least one of high-definition audio, video, and data, among consumer electronic devices, personal computers, and mobile devices.

A separate wireless communication technology that operates in the 60 GHz band is WiGig technology, which has been standardized as the IEEE 802.11ad standard by the Institute of Electrical and Electronic Engineers (IEEE). WiGig technology enables implementation of physical layer data transmission speeds up to 6.7 Gbps by using a standard channel bandwidth of 2.16 GHz. WiGig technology supports both single carrier (SC) modulation and OFDM (orthogonal frequency division multiplexing) modulation. Further, WiGig technology supports Aggregate-PPDU (aggregate physical layer convergence protocol data units, hereinafter referred to as "A-PPDU") to improve transmission efficiency (see IEEE 802.11ad-2012 P 237 9.13a DMG A-PPDU operation). A-PPDU is technology where two or more PPDUs are transmitted without providing inter-frame spacing (IFS) or preambles therebetween.

WiGig technology can be used to substitute for cables in a wired digital interface. For example, WiGig technology can be used to implement a wireless Universal Serial Bus (USB) link for instantaneous synchronization in video streaming transmission to smartphones, tablets, or over an high definition multimedia interface (HDMI, a registered trademark) link.

The newest wired digital interfaces (e.g., USB 3.5 and HDMI 1.3) are capable of data transmission speeds up to several tens of Gbps, and accordingly WiGig technology is evolving to rival these. Technology where downwards compatibility with current WiGig (legacy WiGig) technology is maintained while supporting data transmission by variable channel bandwidth of the standard channel bandwidth or higher is desired for Next Generation 60 GHz (NG60) WiGig technology, in order to achieve physical layer data transmission speeds up to several tens of Gbps.

SUMMARY

In order to maintain downwards compatibility with legacy WiGig devices, NG60 WiGig (non-legacy WiGig) devices are required to support both LF (Legacy Format) PPDUs using the standard channel bandwidth defined in IEEE 802.11ad and MF (Mixed Format) PPDUs using variable channel bandwidth. Accordingly, there is demand regarding NG60 WiGig (non-legacy WiGig) devices for definition of a format and transmission method for A-PPDUs where transmission efficiency can be maximized.

One non-limiting and exemplary embodiment provides a non-legacy A-PPDU transmission device whereby transmission efficiency can be improved.

In one general aspect, the techniques disclosed here feature a transmission device including: a signal processing circuit that generates an aggregate physical layer convergence protocol data unit (A-PPDU) by adding a guard interval to each of a first part of a first physical layer convergence protocol data unit (PPDU) transmitted over each of a first through L'th channel of a predetermined channel bandwidth, where L is an integer of 2 or greater, a second part of the first PPDU transmitted over each of an (L+1)'th through P'th channel, which is a variable channel bandwidth that is N times the predetermined channel bandwidth, where N is an integer of 2 or greater and P is an integer of L+1 or greater, and a second PPDU transmitted over the (L+1)'th through P'th channel; and a wireless circuit that transmits the A-PPDU. The first PPDU includes a legacy STF, a legacy CEF, a legacy header field, a non-legacy STF, a non-legacy CEF, one or more non-legacy header fields including one or more non-legacy headers, and one or more data fields including one or more payload data. The first part of the first PPDU includes the legacy STF, the legacy CEF, the legacy header field, and the non-legacy header field. The second part of the first PPDU includes the non-legacy STF, the non-legacy CEF, and the one or more data fields. The second PPDU includes the one or more non-legacy header fields and the one or more data fields. In a case where the wireless circuit transmits the first PPDU and the second PPDU by single carrier, each of the one or more non-legacy header fields of the second PPDU includes a non-legacy header that has been repeated N times.

Transmission efficiency can be improved by using the non-legacy A-PPDU transmission device and transmission method according to the present disclosure.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2 is a diagram illustrating an example of the structure of a legacy header of an LF SC PPDU according to conventional technology;

FIG. 5 is a diagram illustrating an example of the LF OFDM PPDU format according to conventional technology;

FIG. 6 is a diagram illustrating an example of the structure of a legacy header of an LF OFDM PPDU according to conventional technology;

FIG. 7 is a diagram illustrating an example of the configuration of an LF OFDM PPDU transmission device according to conventional technology;

FIG. 8 is a diagram illustrating an example of the LF OFDM A-PPDU format according to conventional technology;

FIG. 10 is a diagram illustrating an example of the structure of a non-legacy header according to the present disclosure;

DETAILED DESCRIPTION

Various embodiments of the present disclosure will be described below in detail with reference to the attached drawings. Detailed description of known functions and configuration included in the present specification are omitted from the following description, for the sake of clarity and conciseness.

Figure 1:
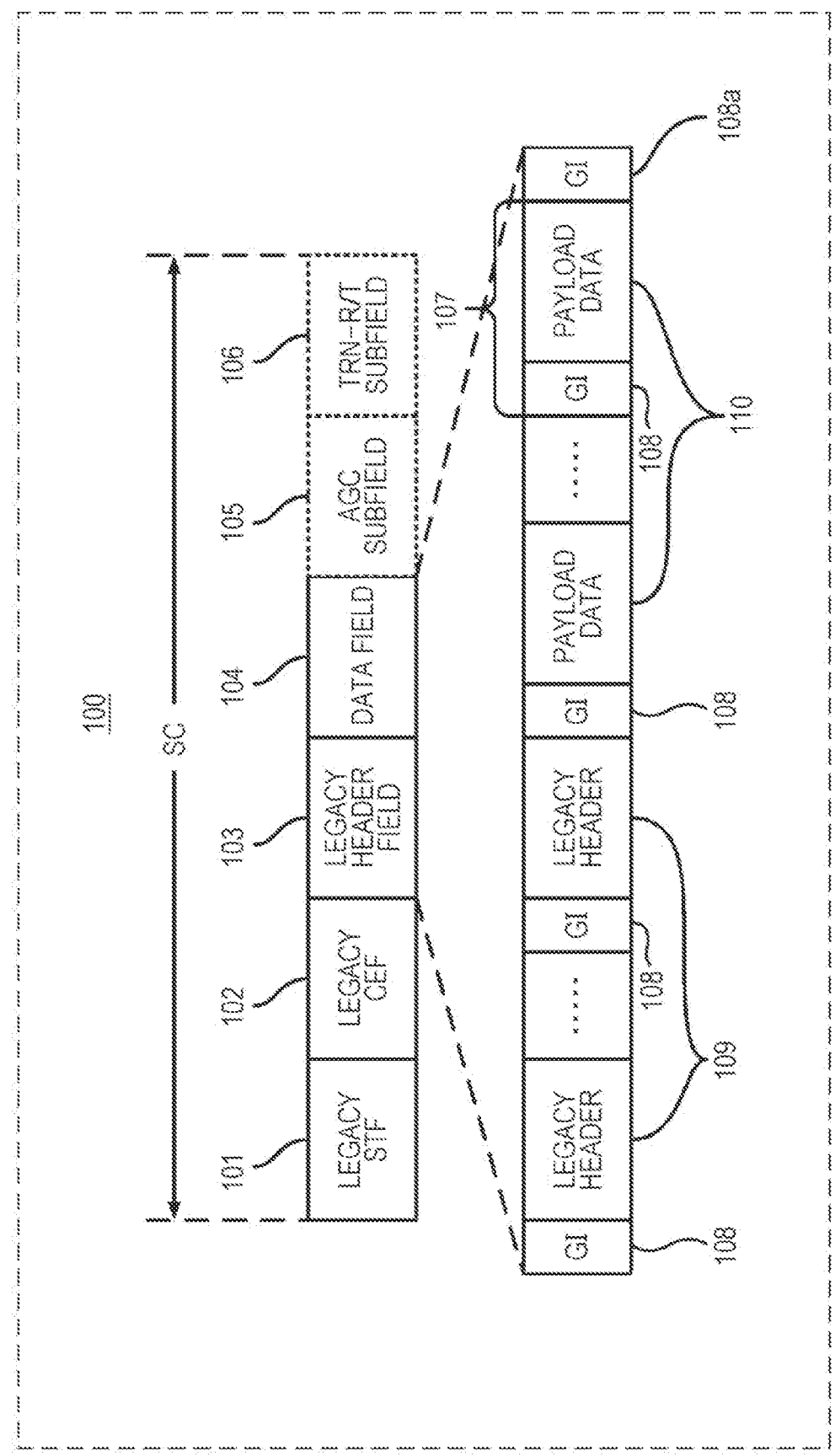
FIG. 1 is a diagram illustrating an example of the LF SC PPDU format according to conventional technology.

FIG. 1 is a diagram illustrating an example of the format of an LF SC PPDU 100 according to conventional technology. The LF SC PPDU 100 includes a legacy STF 101, a legacy CEF 102, legacy header field 103 and data field 104, an optional AGC subfield 105, and an optional TRN-R/T subfield 106.

The legacy STF 101 is used for packet detection, automatic gain control (AGC), frequency offset estimation, and synchronization. The legacy CEF 102 is used for channel estimation. The legacy header field 103 includes a legacy header 109 that defines details of the LF SC PPDU 100. FIG. 2 illustrates multiple fields included in each legacy header 109.

The data field 104 includes payload data 110 of the LF SC PPDU 100. At least one of audio, video, and data is included in the payload data 110. The data octet count of the data field 104 is specified by the Length field of each legacy header 109, and the modulation format and the code rate used in the data field 104 are specified by the Modulation and Coding Scheme (MCS) field of the legacy header 109.

The AGC subfield 105 and TRN-R/T subfield 106 are present when the LF SC PPDU 100 is used for beam fine adjustment or tracking control. The length of the AGC subfield 105 and TRN-R/T subfield 106 are specified by the Training Length field of the legacy header 109. Whether the TRN-R/T subfield 106 is used as a TRN-R subfield, and whether or not used as a TRN-T subfield, is specified by the Packet Type field of the legacy header 109. All fields of the LF SC PPDU 100 are transmitted by SC modulation using the 2.16 GHz standard channel bandwidth, as illustrated in FIG. 1.

Figure 3:
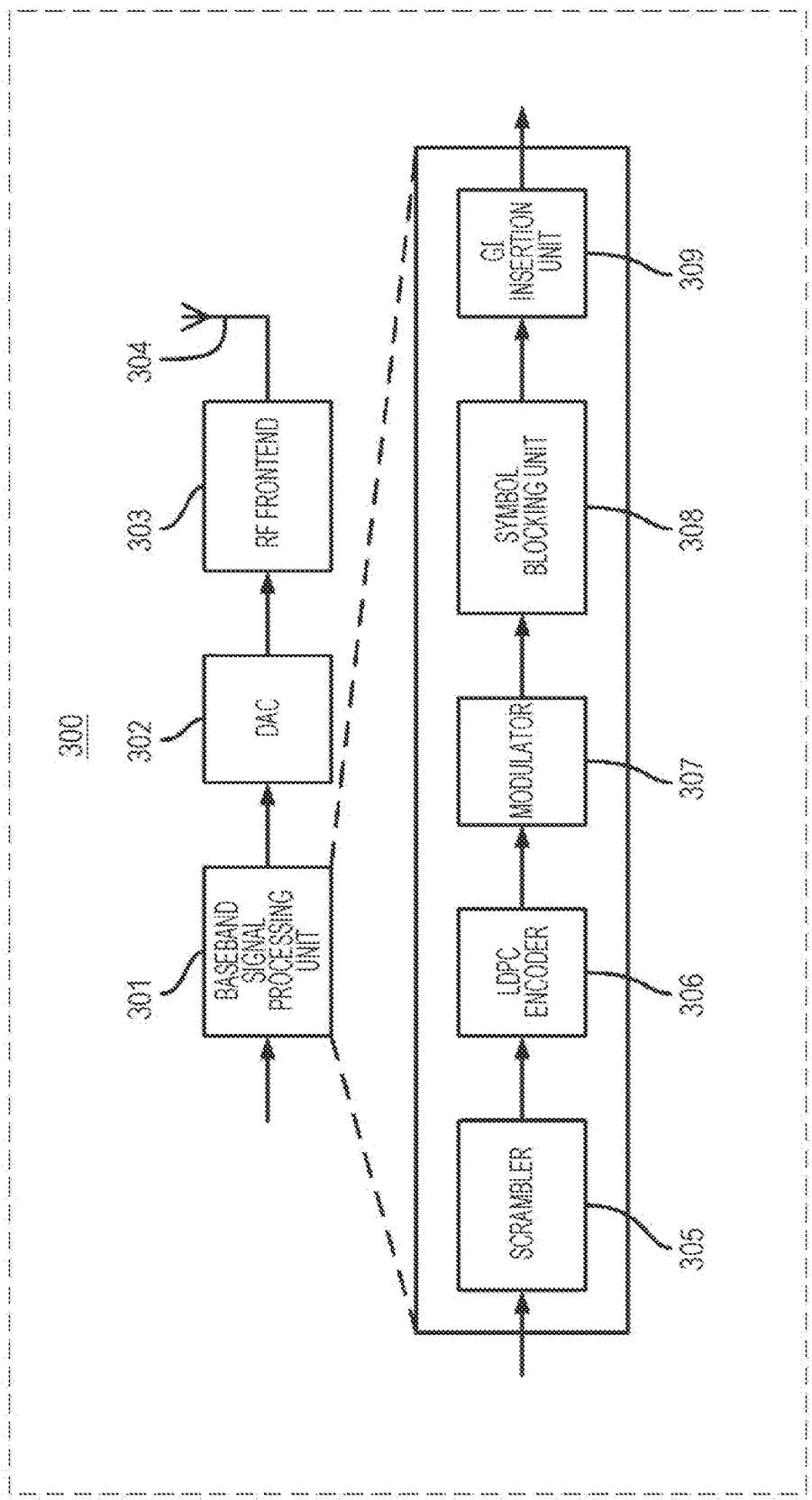
FIG. 3 is a diagram illustrating an example of the configuration of an LF SC PPDU transmission device according to conventional technology.

FIG. 3 is a diagram illustrating an example of the configuration of an LF SC PPDU transmission device 300 according to the conventional technology. The transmission device 300 has a baseband signal processing unit 301, a digital to analog converter (DAC) 302, a radio frequency (RF) frontend 303, and an antenna 304. Further, the baseband signal processing unit 301 has a scrambler 305, a low density parity check (LDPC) encoder 306, a modulator 307, a symbol blocking unit 308, and a guard interval (GI) insertion unit 309.

The scrambler 305 scrambles bits of the legacy header field 103 and data field 104. The scrambler 305 is initialized following the Scrambler Initialization field of the legacy header 109, and starts scrambling from the MCS field of the legacy header 109.

The LDPC encoder 306 performs LDPC encoding of the legacy header field 103 by a ¾ code rate, and generates an LDPC codeword. The modulator 307 converts the LDPC codeword into 448 complex constellation points using π/2-binary phase shift keying (BPSK). The symbol blocking unit 308 forms blocks of complex constellation points in increments of 448, thereby generating symbol blocks. The GI insertion unit 309 adds a GI 108 made up of a Golay system 64 symbols long, that has been defined beforehand, to the start of the symbol block, thereby generating an SC block.

The LDPC encoder 306 performs LDPC encoding of the payload data 110 in the data field 104, at the code rate specified in the MCS field in the legacy header, thereby generating an LDPC codeword. The modulator 307 coverts the LDPC codeword into multiple complex constellation points using the modulation format specified in the MCS field in the legacy header. The symbol blocking unit 308 forms blocks of complex constellation points in increments of 448, thereby generating symbol blocks.

The GI insertion unit 309 adds the same GI 108 as the legacy header field 103 to the start of each symbol block, thereby generating the SC block 107. Further, in order to facilitate frequency region equalization, the GI insertion unit 309 adds a GI 108a to the end of the final SC block 107 of the data field 104. That is to say, in a case where the Additional PPDU field of the legacy header is not 1, the GI 108a is added.

The DAC 302 converts digital baseband signals, including the LF SC PPDU 100 generated at the baseband signal processing unit 301, into analog baseband signals. The RF frontend 303 converts analog baseband signals including the LF SC PPDU 100 into radio frequency signals by frequency conversion, amplifying, and other such processing. The antenna 304 emits the wireless frequency signals into space.

Figure 4:
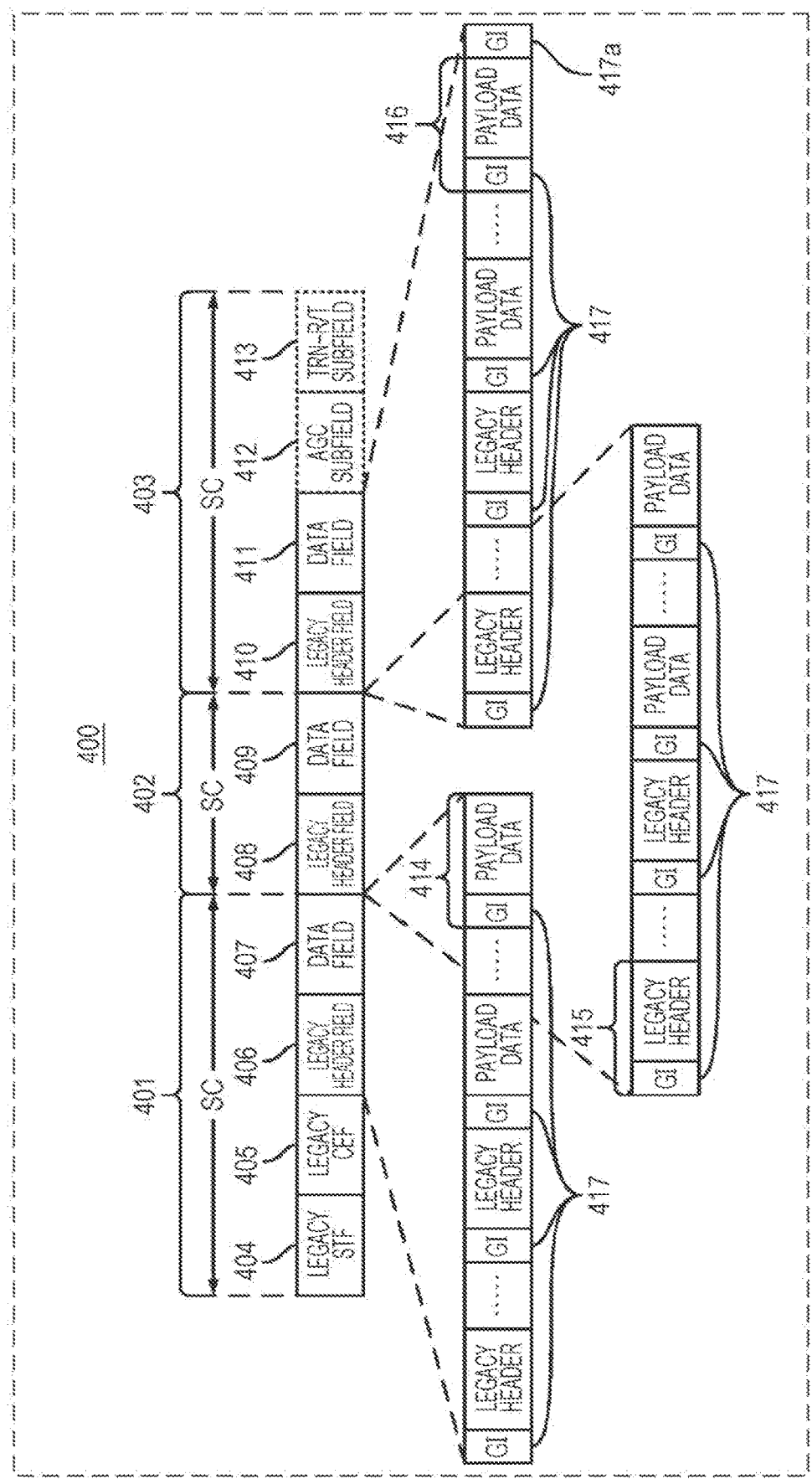
FIG. 4 is a diagram illustrating an example of the LF SC A-PPDU format according to conventional technology.

FIG. 4 is a diagram illustrating an example of the format of an LF SC A-PPDU 400 according to conventional technology. The LF SC A-PPDU 400 is made up of three LF SC PPDUs 401, 402, and 403. The LF SC PPDUs are linked without an IFS or preamble therebetween, and include legacy header fields 406, 408, and 410, and data fields 407, 409, and 411.

For example, the LF SC PPDU 401 disposed at the start of the LF SC A-PPDU 400 includes the legacy header field 406, data field 407, legacy STF 404, and legacy CEF 405. The LF SC PPDU 403 disposed at the end of the LF SC A-PPDU 400 includes the legacy header field 410, data field 411, optional AGC subfield 412 and optional TRN-R/T subfield 413.

Definitions of the legacy STF 404, legacy CEF 405, legacy header fields 406, 408, and 410, AGC subfield 412, and TRN-R/T subfield 413 are the same as the definitions of the corresponding fields of the LF SC PPDU 100 in FIG. 1, so description will be omitted.

With the exception of the LF SC PPDU 403, the LF SC PPDU 401 for example is followed by a different LF SC PPDU 402, so the Additional PPDU field of the legacy header field 410 of the LF SC PPDU 403 is set to 0, while the Additional PPDU fields of the legacy header fields 406 and 408 of the other LF SC PPDUs 401 and 402 are set to 1.

For example, with the exception of the data field 411 of the LF SC PPDU 403, the final SC block 414 of the data field 407 is followed by the SC block 415 at the start of the legacy header field 408 of a different LF SC PPDU 402, so addition of a GI 417a is omitted, but the end of the final SC block 416 of the data field 411 of the LF SC PPDU 403 is followed by no SC block, so a GI 417a is added. That is to say, in a case where the Additional PPDU field of a legacy header is 1, addition of the GI 417a is omitted. Note that all fields of the LF SC A-PPDU 400 are transmitted by SC modulation using the 2.16 GHz standard channel bandwidth.

FIG. 5 is a diagram illustrating an example of the format of an LF OFDM PPDU 500 according to conventional technology. The LF OFDM PPDU 500 includes a legacy STF 501, a legacy CEF 502, legacy header field 503, a data field 504, an optional AGC subfield 505, and an optional TRN-R/T subfield 506. Definitions of the legacy STF 501, legacy CEF 502, AGC subfield 505, and TRN-R/T subfield 506 are the same as the definitions of the corresponding fields of the LF SC PPDU 100 in FIG. 1, so description will be omitted.

The legacy header field 503 includes a legacy header 510 defining details of the LF OFDM PPDU 500. FIG. 6 illustrates multiple fields included in the legacy header 510. The data field 504 includes payload data 511 of the LF OFDM PPDU 500. Note that all fields of the LF OFDM PPDU 500 are transmitted using the 2.16 GHz standard channel bandwidth. The legacy STF 501, legacy CEF 502, AGC subfield 505, and TRN-R/T subfield 506 are transmitted by SC modulation, while the legacy header field 503 and data field 504 are transmitted by OFDM modulation.

The legacy header field 503 and data field 504 transmitted by OFDM modulation are transmitted at a faster sampling rate than the legacy STF 501, legacy CEF 502, AGC subfield 505, and TRN-R/T subfield transmitted by SC modulation. Accordingly, sampling rate conversion processing is necessary at the boundary between the legacy CEF 502 and the legacy header field 503, and the boundary between the data field 504 and AGC subfield 505.

FIG. 7 is a diagram illustrating an example of the configuration of an LF OFDM PPDU transmission device 700 according to conventional technology. The transmission device 700 has a baseband signal processing unit 701, a DAC 702, an RF frontend 703, and an antenna 704. The baseband signal processing unit 701 further includes a scrambler 705, an LDPC encoder 706, a modulator 707, a subcarrier mapping unit 708, an IFFT unit 709, and a GI insertion unit 710.

The scrambler 705 scrambles bits of the legacy header field 503 and data field 504. The scrambler 705 is initialized following the Scrambler Initialization field of the legacy header, and starts scrambling from the MCS field of the legacy header.

The LDPC encoder 706 performs LDPC encoding of the legacy header 510 by a ¾ code rate, and generates an LDPC codeword. The modulator 707 converts the LDPC codeword into 336 complex constellation points using quadrature phase shift keying (QSPK). The subcarrier mapping unit 708 maps the 336 complex constellation points as to 336 data subcarriers following rules defined beforehand.

There are a total of 512 subcarriers, with the remaining 176 subcarriers being used as DC subcarrier, pilot subcarrier, and guard band. The IFFT unit 709 converts the legacy header 510 subcarrier-mapped in frequency region, to time region signals by IFFT processing at 512 points. The GI insertion unit 710 copies the trailing 128 samples of the output signals from the IFFT unit 709 and connects these to the start of the IFFT output signals as a GI 507, thereby generating OFDM symbols. Note that a GI may be referred to as a cyclic prefix (CP) with regard to OFDM symbols.

The LDPC encoder 706 performs LDPC encoding of the payload data 511, at the code rate specified in the MCS field in the legacy header 510, thereby generating an LDPC codeword. The modulator 707 coverts the LDPC codeword into multiple complex constellation points using the modulation format specified in the MCS field in the legacy header 510.

The subcarrier mapping unit 708 maps the 336 complex constellation points as to 336 data subcarriers following rules defined beforehand. There are a total of 512 subcarriers, with the remaining 176 subcarriers being used as DC subcarrier, pilot subcarrier, and guard band.

The IFFT unit 709 converts the payload data 511 subcarrier-mapped in frequency region, to time region signals by IFFT processing at 512 points. The GI insertion unit 710 copies the trailing 128 samples of the output signals from the IFFT unit 709 and connects these to the start of the IFFT output signals as a GIs 508 and 509, thereby generating OFDM symbols.

The DAC 702 converts digital baseband signals, including the LF OFDM PPDU 100 generated at the baseband signal processing unit 701, into analog baseband signals. The RF frontend 703 converts analog baseband signals including the LF OFDM PPDU 100 into radio frequency signals by frequency conversion, amplifying, and other such processing. The antenna 704 emits the wireless frequency signals into space.

FIG. 8 is a diagram illustrating an example of the format of an LF OFDM A-PPDU 800 according to conventional technology. The LF OFDM A-PPDU 800 is made up of three LF OFDM PPDUs 801, 802, and 803. The LF OFDM PPDUs are linked without an IFS or preamble therebetween, and include legacy header fields 806, 808, and 810, and data fields 807, 809, and 811.

The LF OFDM PPDU 801 disposed at the start of the LF OFDM A-PPDU 800 includes the legacy header field 806, data field 807, legacy STF 804, and legacy CEF 805. The LF OFDM PPDU 803 disposed at the end of the LF OFDM A-PPDU 800 includes the legacy header field 810, data field 811, optional AGC subfield 812, and optional TRN-R/T subfield 813. Definitions of the legacy STF 804, legacy CEF 805, legacy header fields 806, 808, and 810, data fields 807, 809, and 811, AGC subfield 812, and TRN-R/T subfield 813 are the same as the definitions of the corresponding fields of the LF OFDM PPDU 500 in FIG. 5, so description will be omitted.

In FIG. 8, the LF OFDM PPDUs 801 and 802 are followed by different LF OFDM PPDUs 802 and 803, so the Additional PPDU fields of the legacy header fields 806 and 808 of the LF OFDM PPDU 801 and 802 are set to 1, while the Additional PPDU field of the legacy header field 810 of the LF OFDM PPDU 803 that has no following LF OFDM PPDU is set to 0.

In FIG. 8, all fields of the LF OFDM A-PPDU 800 are transmitted using the 2.16 GHz standard channel bandwidth. The legacy STF 804, legacy CEF 805, AGC subfield 812, and TRN-R/T subfield 813 of the LF OFDM A-PPDU 800 are transmitted by SC modulation, while the legacy headers 806, 808, 810 and data fields 807, 809, and 811 are transmitted by OFDM modulation. Note that in FIG. 8, the payload data 814 at the last stage of each LF OFDM PPDU does not have to be followed by a GI 815.

Figure 9:
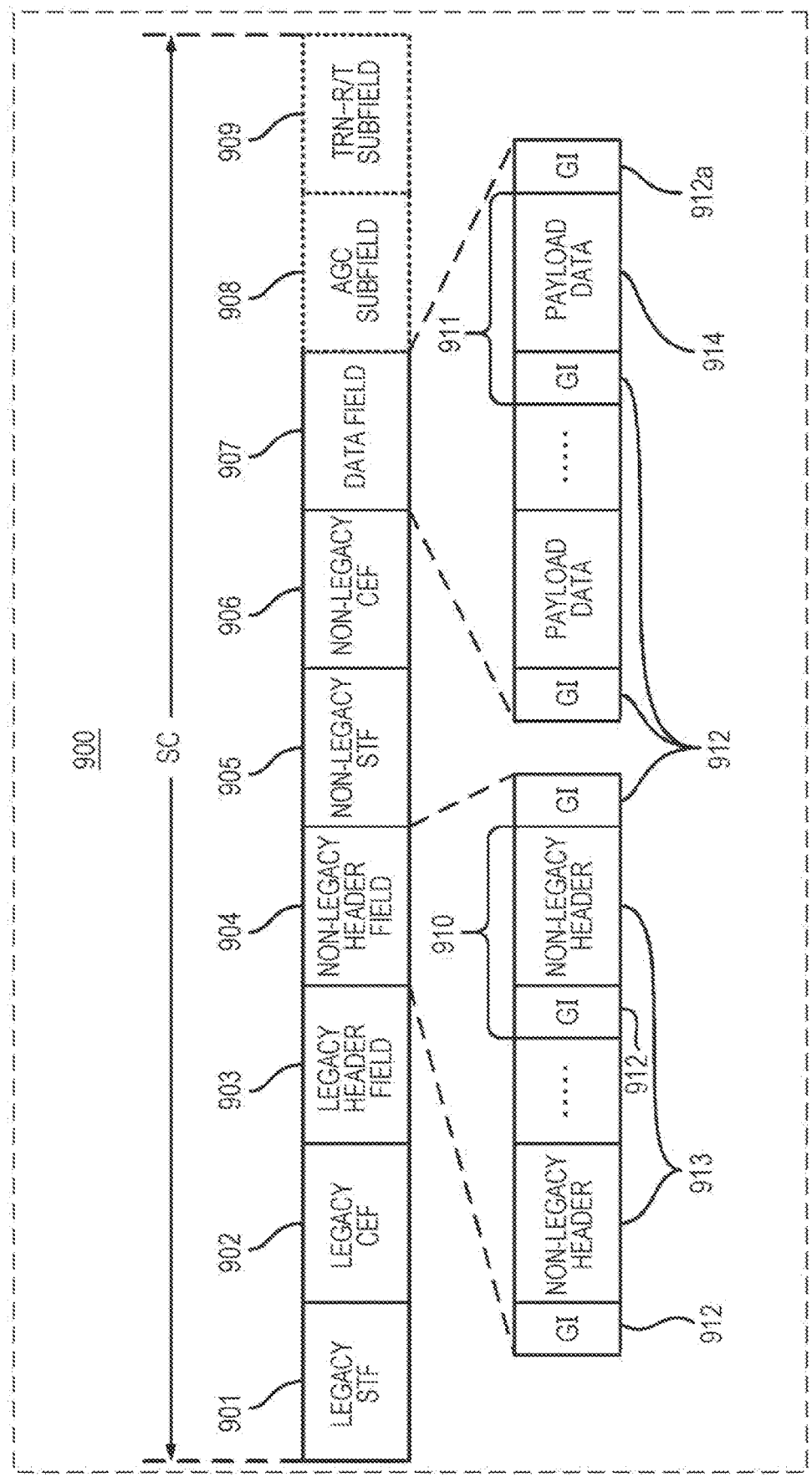
FIG. 9 is a diagram illustrating an example of the MF SC PPDU format transmitting by a standard channel bandwidth according to the present disclosure.

FIG. 9 is a diagram illustrating an example of the format of an MF SC PPDU 900 transmitted at standard channel bandwidth according to the present disclosure. The MF SC PPDU 900 includes a legacy STF 901, a legacy CEF 902, a legacy header field 903, a non-legacy header field 904, a non-legacy STF 905, a non-legacy CEF 906, a data field 907, an optional AGC subfield 908, and an optional TRN-R/T subfield 909.

Note however, that the non-legacy STF 905 and non-legacy CEF 906 may be omitted in a case where the data field 907 is transmitted using single input single output (SISO), since the AGC level adjusted at the legacy STF 901 and the channel estimation results obtained at the legacy CEF 902 can be used for the data field 907. Definitions of the legacy STF 901, legacy CEF 902, legacy header field 903, AGC subfield 908, and TRN-R/T subfield 909 are the same as the definitions of the corresponding fields of the LF SC PPDU 100 in FIG. 1, so description will be omitted.

The non-legacy header field 904 includes a non-legacy header 913 that defines details of the MF SC PPDU 900. FIG. 10 illustrates multiple fields included in a non-legacy header.

In a case where the non-legacy STF 905 or the non-legacy CEF 906 is present in the MF SC PPDU 900, a GI 912 is added to the end of the last SC block 910 of the non-legacy header field 904, in order to facilitate frequency region equalization.

The non-legacy STF 905 is used for AGC readjustment. The non-legacy CEF 906 is used for channel estimation for the data field 907.

The data field 907 includes payload data 914 of the MF SC PPDU 900. The data octet count of the data field 907 is specified by the PSDU Length field of each non-legacy header, and the modulation format and the code rate used in the data field 907 are specified by the non-legacy MCS field of the non-legacy header. A GI 912a is added to the end of the last SC block 911 of the data field 907, in order to facilitate frequency region equalization. Note that all fields of the MF SC PPDU 900 are transmitted by SC modulation using the 2.16 GHz standard channel bandwidth.

Figure 11:
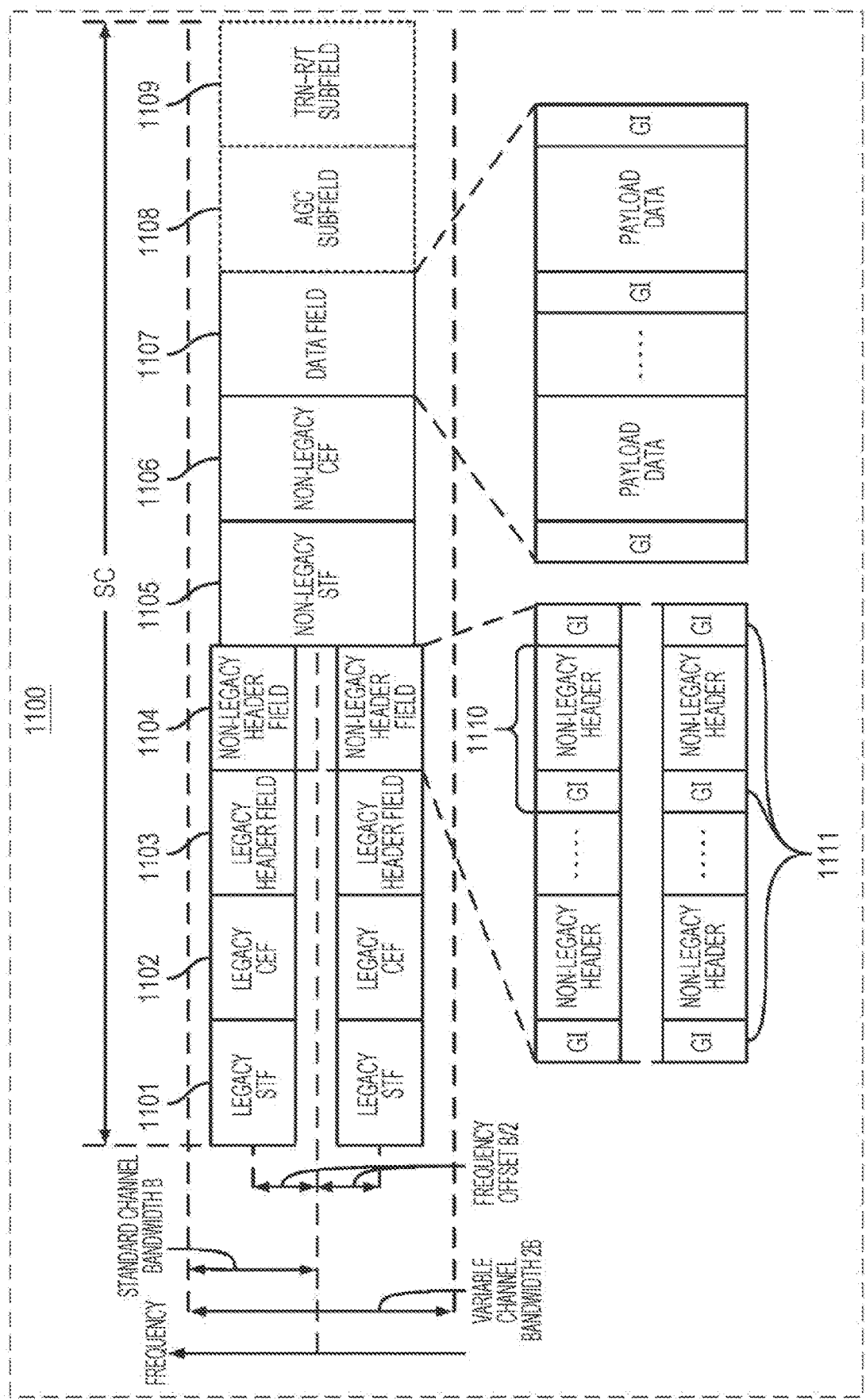
FIG. 11 is a diagram illustrating an example of the MF SC PPDU format transmitted at a variable channel bandwidth that is twice the standard channel band width according to the present disclosure.

FIG. 11 is a diagram illustrating an example of the format of an MF SC PPDU 1100 transmitted at a variable channel bandwidth that is double the standard channel bandwidth according to the present disclosure. The MF SC PPDU 1100 includes a legacy STF 1101, a legacy CEF 1102, a legacy header field 1103, a non-legacy header field 1104, a non-legacy STF 1105, a non-legacy CEF 1106, a data field 1107, an optional AGC subfield 1108, and an optional TRN-R/T subfield 1109. Definitions of the legacy STF 1101, legacy CEF 1102, legacy header field 1103, non-legacy header field 1104, optional AGC subfield 1108, and optional TRN-R/T subfield 1109 are the same as the definitions of the corresponding fields of the MF SC PPDU 900 in FIG. 9, so description will be omitted.

The channel bandwidth differs among the data field 1107, legacy STF 1101, and legacy CEF 1106, so the non-legacy STF 1105 and non-legacy CEF 1106 are present in the MF SC PPDU 1100. Accordingly, a GI 1111 using the 2.16 GHz standard channel bandwidth is added to the end of the final SC block 1110 of the non-legacy header field 1104.

In FIG. 11, the legacy STF 1101, legacy CEF 1102, legacy header field 1103, and non-legacy header field 1104 are duplicated, and transmitted by the standard channel bandwidth B (i.e., 2.16 GHz), each with a frequency offset B/2 that is half band of the standard channel bandwidth B (i.e., 1.08 GHz).

On the other hand, the non-legacy STF 1105, non-legacy CEF 1106, data field 1107, AGC subfield 1108, and TRN-R/T subfield 1109 are transmitted at the variable channel bandwidth 2B that is a band double the standard channel bandwidth B (i.e., 4.32 GHz). Accordingly, sampling rate conversion processing is performed at the boundary between the non-legacy header field 1104 and non-legacy STF 1105. Note that all fields of the MF SC PPDU 1100 are transmitted by SC modulation. Although the illustration in FIG. 11 takes into consideration the bandwidth that each field occupies, illustration in subsequent diagrams will be made using channel bandwidth, for the sake of simplifying the drawings.

Figure 12:
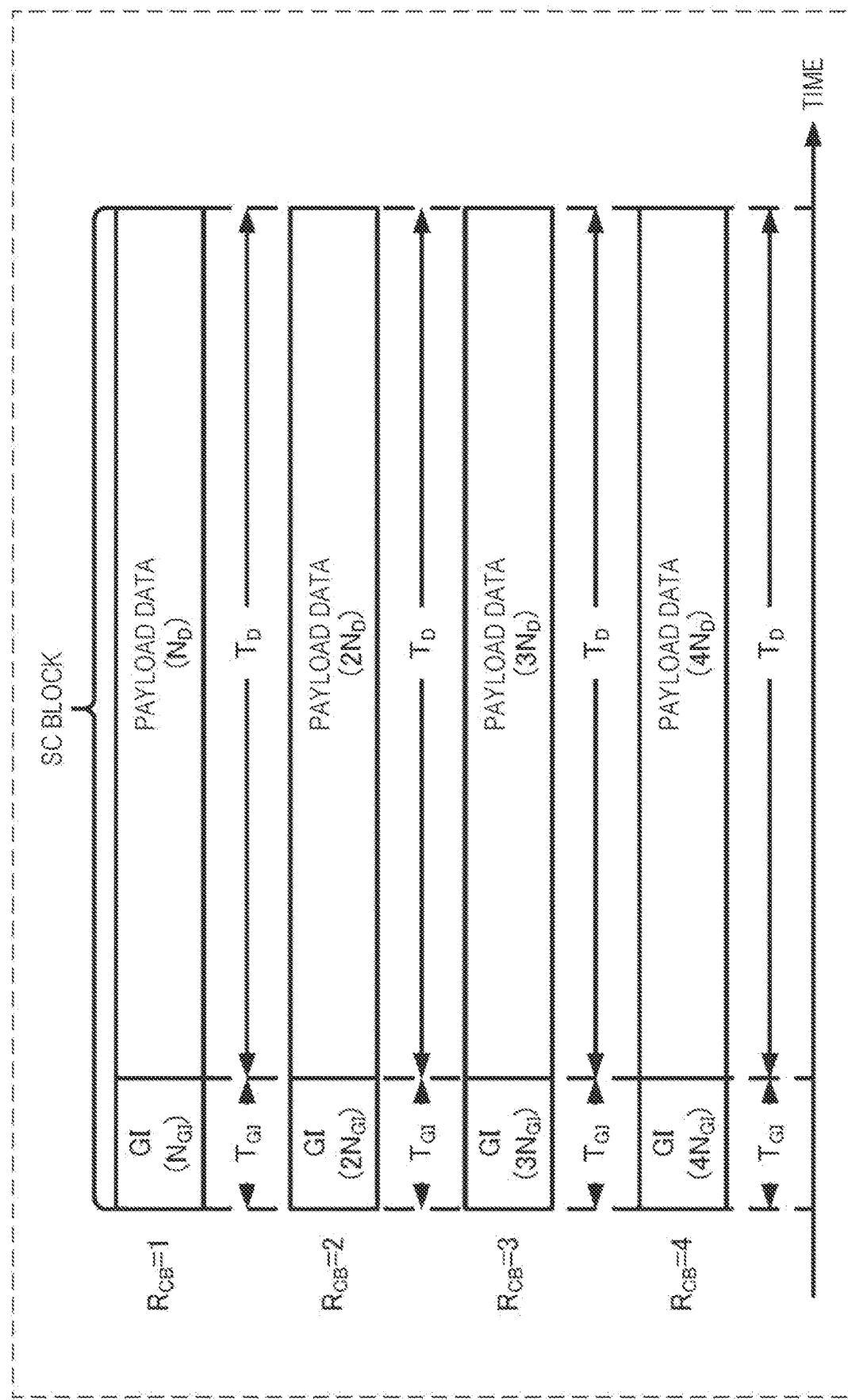
FIG. 12 is a diagram illustrating an example of a detailed configuration of an SC block in a data field of an MF SC PPDU according to the present disclosure.

FIG. 12 is a diagram illustrating an example of a detailed configuration of an SC block in a data field of an MF SC PPDU according to the present disclosure. Illustrated are a symbol count $N_{GI}$ of a GI when using the standard channel bandwidth, a symbol count $N_D$ of payload data per SC block when using the standard channel bandwidth, GI period $T_{GI}$, data period $T_D$ of payload data, and ratio of standard channel bandwidth and variable channel bandwidth (i.e., variable channel bandwidth/standard channel bandwidth) $R_{CB}$. Accordingly, $R_{CB}=1$ indicates the SC block configuration of the data field 907 in FIG. 9, while $R_{CB}=2$ indicates the SC block configuration of the data field 1107 in FIG. 11.

It is demanded of symbol blocking and GI insertion to maintain interference avoidance capabilities regarding multipath delay waves and transmission efficiency, which is to say to maintain the GI period to $T_{GI}$ regardless of the $R_{CB}$, and keep the ratio between the GI period $T_{GI}$ and the data period $T_D$ constant. The GI and payload data symbol length is short in proportion to $R_{CB}$, so the GI period is maintained at $T_{GI}$ by setting the GI size to $R_{CB} \times N_{GI}$. Also, the data period is maintained at $T_D$ by setting the data size to $R_{CB} \times N_D$. The ratio between the GI period and the data period is kept constant by the above settings. Note that the SC block configuration in the non-legacy header field transmitted at the standard channel bandwidth is the same as the case where $R_{CB}=1$.

Figure 13:
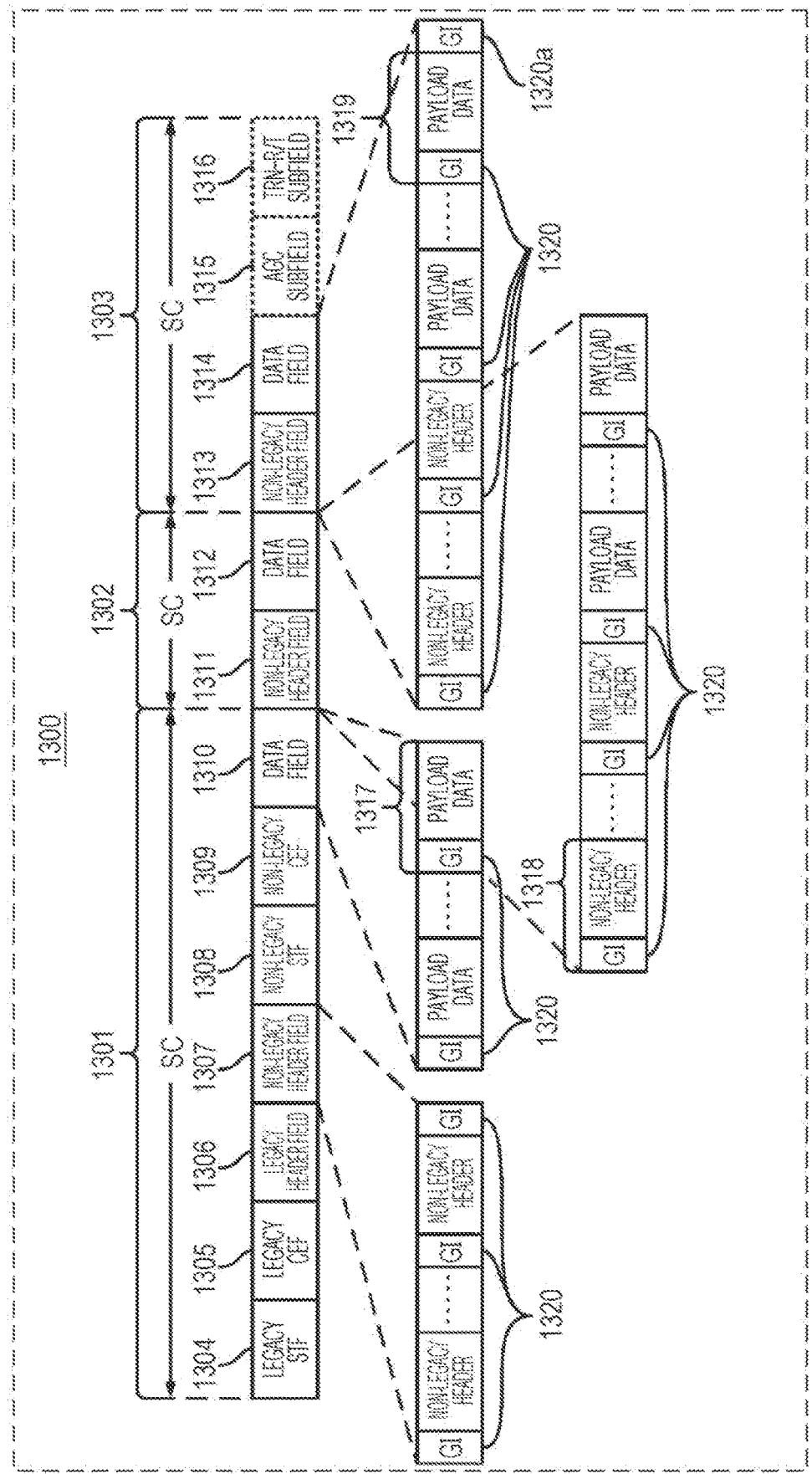
FIG. 13 is a diagram illustrating an example of the MF SC A-PPDU format transmitted at the standard channel bandwidth according to the present disclosure.

FIG. 13 is a diagram illustrating an example of the format of an MF SC A-PPDU 1300 transmitted at the standard channel bandwidth, according to the present disclosure. The MF SC A-PPDU 1300 includes three MF SC PPDUs 1301, 1302, and 1303. The MF SC PPDUs are linked without an IFS or preamble therebetween, and include non-legacy header fields and data fields.

For example, the MF SC PPDU 1301 disposed at the start of the MF SC A-PPDU 1300 includes a non-legacy header field 1307, data field 1310, legacy STF 1304, legacy CEF 1305, legacy header field 1306, non-legacy STF 1308, and non-legacy CEF 1309.

Note however, that in a case where the data fields 1310, 1312, and 1314 are transmitted using SISO, the non-legacy STF 1308 and non-legacy CEF 1309 may be omitted, since the AGC level adjusted at the legacy STF 1304 and channel estimation results obtained at the legacy CEF 1305 can be used in the data fields 1310, 1312, and 1314.

Note that the MF SC PPDU 1303 at the end of the MF SC A-PPDU 1300 includes a non-legacy header field 1313, a data field 1314, an optional AGC subfield 1315, and an optional TRN-R/T subfield 1316. Definitions of the legacy STF 1304, legacy CEF 1305, legacy header field 1306, non-legacy header fields 1307, 1311, and 1313, non-legacy STF 1308, non-legacy CEF 1309, AGC subfield 1315, and TRN-R/T subfield 1316 are the same as the definitions of the corresponding fields of the MF SC PPDU 900 in FIG. 9, so description will be omitted.

The MF SC PPDU 1303 is not followed by another MF SC PPDU, so the Additional PPDU field of the non-legacy header field 1313 of the MF SC PPDU 1303 is set to 0, while the MF SC PPDUs 1301 and 1302 are followed by other MF SC PPDUs 1302 and 1303, so the Additional PPDU field of the non-legacy header fields (1307 and 1311) are set to 1. Note that the Additional PPDU field in the legacy header field 1306 is set to 0, so that the MF SC A-PPDU 1300 will be received as a conventional LF SC PPDU by a legacy device.

With the exception of the data field 1314 of the MF SC PPDU 1303, for example, the final SC block 1317 of the data field 1310 is followed by the SC block 1318 at the start of the non-legacy header field 1311 of the following MF SC PPDU 1302, so addition of a GI 1320a is omitted, but the final SC block 1319 of the data field 1314 of the MF SC PPDU 1303, regarding which there is no following MF SC PPDU, is followed by no SC block, so a GI 1320a is added to the end. That is to say, in a case where the Additional PPDU field of a legacy header is 1, addition of the GI 1320a is omitted. Note that all fields of the MF SC A-PPDU 1300 are transmitted by SC modulation using the 2.16 GHz standard channel bandwidth.

Figure 14:
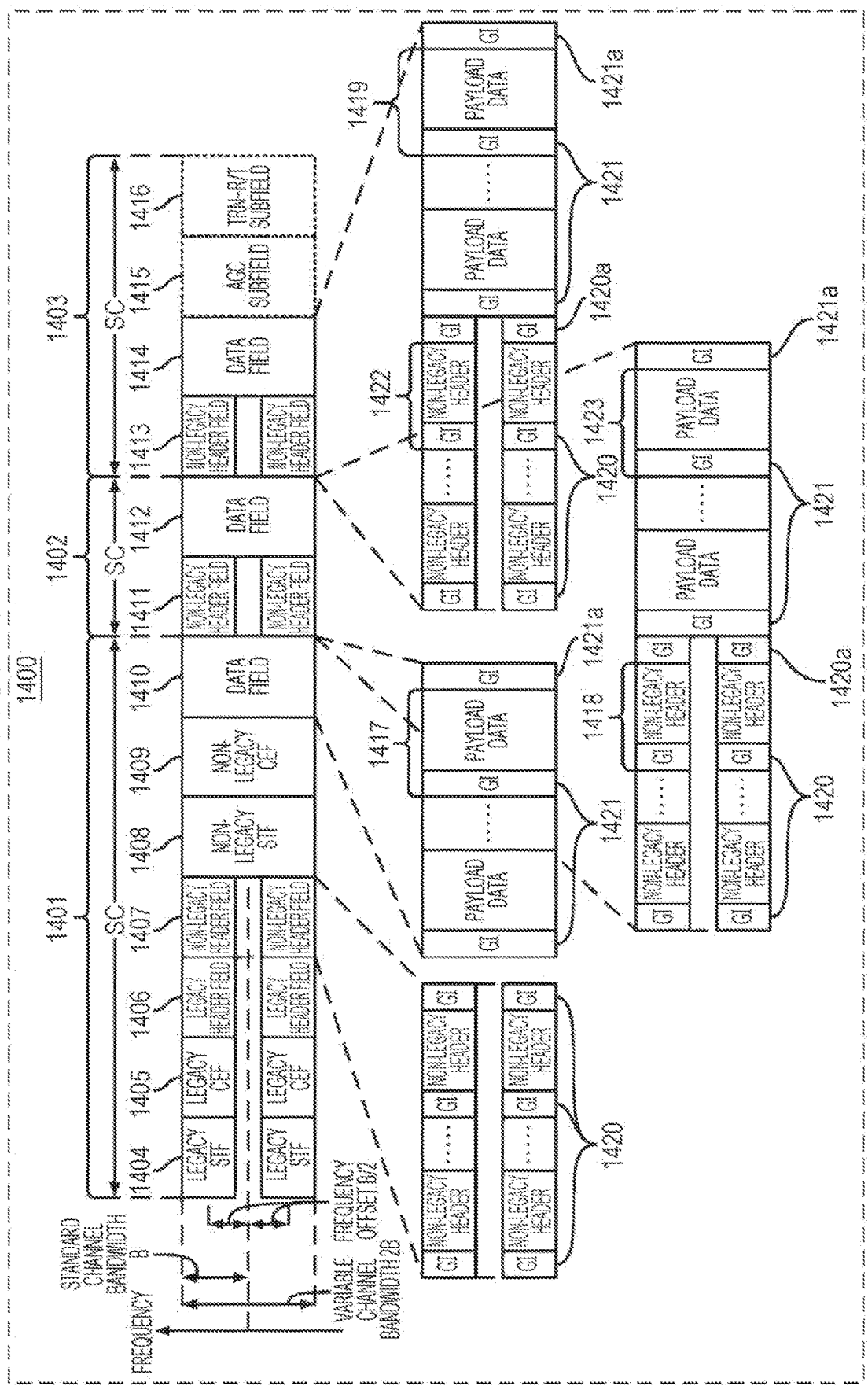
FIG. 14 is a diagram illustrating an example of the MF SC A-PPDU format transmitted at a variable channel bandwidth that is twice the standard channel band width according to the present disclosure.

FIG. 14 is a diagram illustrating an example of the format of an MF SC A-PPDU 1400 transmitted at the variable channel bandwidth that is a band double the standard channel bandwidth. The MF SC A-PPDU 1400 is made up of three MF SC PPDUs 1401, 1402, and 1403. The MF SC PPDUs are linked without an IFS or preamble therebetween, and include non-legacy header fields and data fields.

For example, the MF SC PPDU 1401 disposed at the start of the MF SC A-PPDU 1400 includes a non-legacy header field 1407, data field 1410, legacy STF 1404, legacy CEF 1405, legacy header field 1406, non-legacy STF 1408, and non-legacy CEF 1409.

Note that the MF SC PPDU 1403 disposed at the end of the MF SC A-PPDU 1400 includes a non-legacy header field 1407, a data field 1410, an optional AGC subfield 1415, and an optional TRN-R/T subfield 1416. Definitions of the legacy STF 1404, legacy CEF 1405, legacy header field 1406, non-legacy header fields (1407, 1411, and 1413), non-legacy STF 1408, non-legacy CEF 1409, AGC subfield 1415, and TRN-R/T subfield 1416 are the same as the definitions of the corresponding fields of the MF SC PPDU 1100 in FIG. 11, so description will be omitted.

The MF SC PPDU 1403 is not followed by another MF SC PPDU, for example, so the Additional PPDU field of the non-legacy header field 1413 is set to 0, while the MF SC PPDUs 1401 and 1402 are followed by another MF SC PPDU, so the Additional PPDU field of the non-legacy header fields 1407 and 1411 are set to 1. Note that the Additional PPDU field of the legacy header in the legacy header field 1406 is set to 0, so that the MF SC A-PPDU 1400 will be received as a conventional LF SC PPDU by a legacy device.

The data fields 1410, 1412, and 1414 are transmitted by a broader channel bandwidth than the non-legacy header fields 1407, 1411, and 1413, so a GI 1420a is added to the end of the final SC blocks 1418 and 1422 of the non-legacy header fields 1411 and 1413 in the MF SC PPDUs 1402 and 1403, even in a case where data fields 1412 and 1414 immediately follow the non-legacy header fields 1411 and 1413.

The MF SC PPDU 1403 is not followed by another MF SC PPDU, so a GI 1421a is added to the end of the final SC block 1419 of the data field 1414. On the other hand, the MF SC PPDUs 1401 and 1402 are followed by other MF SC PPDUs 1402 and 1403, but the channel bandwidth differs between the data fields 1410 and 1412 and the subsequent non-legacy header fields 1411 and 1413, so a GI 1421a is added to the end of the final SC block 1417 and 1423 of the data fields 1410 and 1412, in the same way as with the MF SC PPDU 1403. Also, sampling rate conversion processing is performed at the boundaries between the data fields 1410 and 1412, and the subsequent non-legacy header fields 1411 and 1413.

In FIG. 14, the legacy STF 1404, legacy CEF 1405, legacy header field 1406, and non-legacy header field 1407 are duplicated, and transmitted by the standard channel bandwidth B (i.e., 2.16 GHz), each with a frequency offset B/2 that is half band of the standard channel bandwidth B (i.e., 1.08 GHz). On the other hand, the non-legacy STF 1408, non-legacy CEF 1409, data fields 1410, 1412, and 1414, AGC subfield 1415, and TRN-R/T subfield 1416 are transmitted at the variable channel bandwidth 2B that is a band double the standard channel bandwidth B (i.e., 4.32 GHz). Note that all fields of the MF SC A-PPDU 1400 are transmitted by SC modulation.

Figure 15:
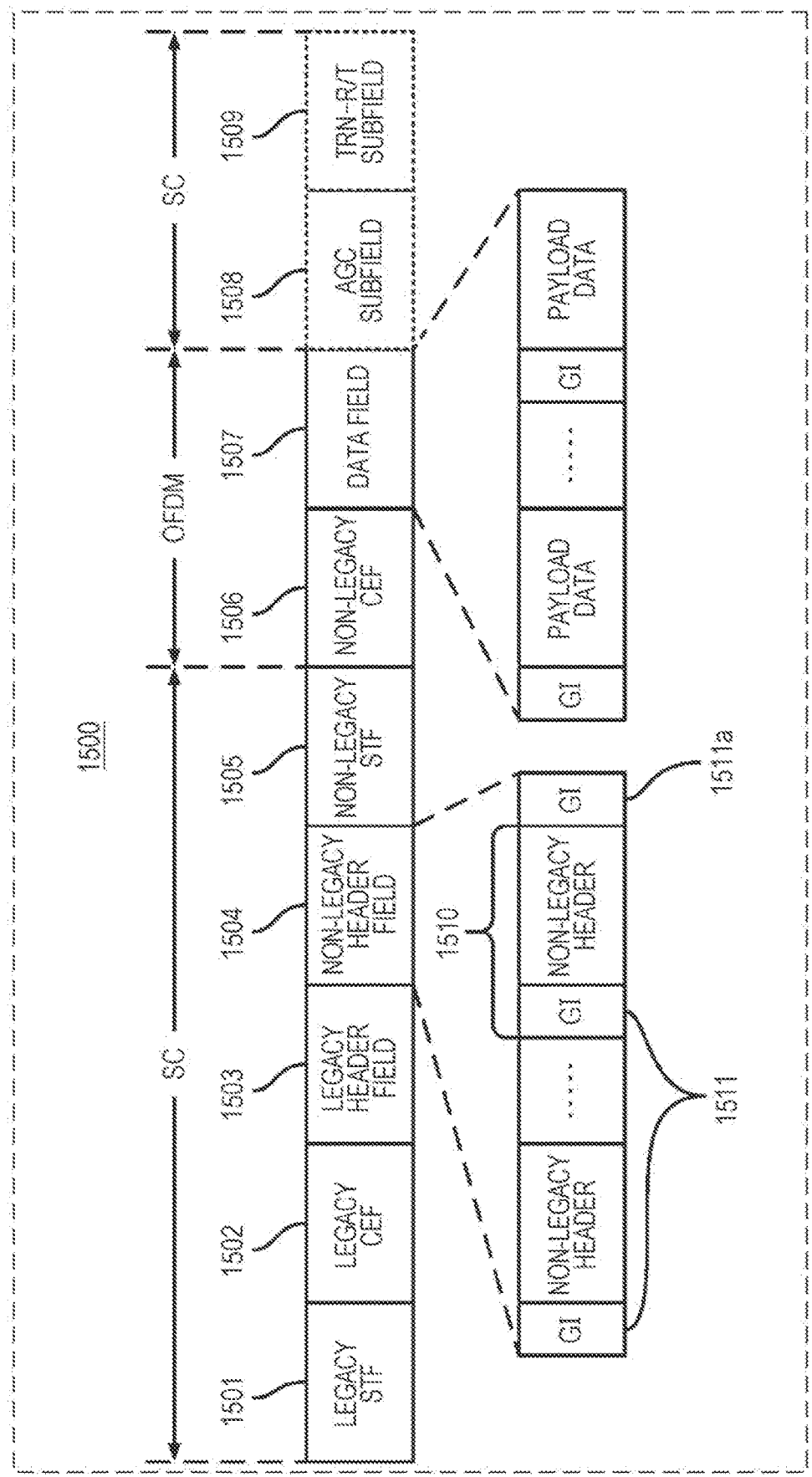
FIG. 15 is a diagram illustrating an example of the MF OFDM PPDU format transmitted at the standard channel bandwidth according to the present disclosure.

FIG. 15 is a diagram illustrating an example of the format of an MF OFDM PPDU 1500 transmitted at the standard channel bandwidth according to the present disclosure. The MF OFDM PPDU 1500 includes a legacy STF 1501, a legacy CEF 1502, a legacy header field 1503, a non-legacy header field 1504, a non-legacy STF 1505, a non-legacy CEF 1506, a data field 1507, an optional AGC subfield 1508, and an optional TRN-R/T 1509. Note that in a case where the data field 1507 is transmitted using SISO, the non-legacy STF 1505 and non-legacy CEF 1506 may be omitted, since the AGC level adjusted at the legacy STF 1501 and channel estimation results obtained at the legacy CEF 1502 can be used in the data field 1507.

Definitions of the legacy STF 1501, legacy CEF 1502, legacy header field 1503, AGC subfield 1508, and TRN-R/T subfield 1509 are the same as the definitions of the corresponding fields of the LF OFDM PPDU 500 in FIG. 5, so description will be omitted. The configuration of the non-legacy header included in the non-legacy header field 1504 is the same as that in FIG. 10.

All fields of the MF OFDM PPDU 1500 in FIG. 15 are transmitted using the 2.16 GHz standard channel bandwidth. The legacy STF 1501, legacy CEF 1502, legacy header field 1503, non-legacy header field 1504, non-legacy STF 1505, AGC subfield 1508, and TRN-R/T subfield 1509 are transmitted by SC modulation, while the non-legacy CEF 1506 and data field 1507 are transmitted by OFDM modulation. Accordingly, a GI 1511a is added to the end of the final SC block 1510 of the non-legacy header field 1504 even in a case where the non-legacy STF 1505 and non-legacy CEF 1506 are not present.

The non-legacy CEF 1506 and data field 1507 that are transmitted by OFDM modulation are transmitted at a faster sampling rate than the legacy STF 1501, legacy CEF 1502, legacy header field 1503, non-legacy header field 1504, non-legacy STF 1505, AGC subfield 1508, and TRN-R/T subfield 1509, which are transmitted by SC modulation, in the same way as with the LF OFDM PPDU 500 in FIG. 5. Accordingly, sampling rate conversion processing is implemented at the boundary between the non-legacy STF 1505 and the non-legacy CEF 1506, and the boundary between the data field 1507 and AGC subfield 1508.

Figure 16:
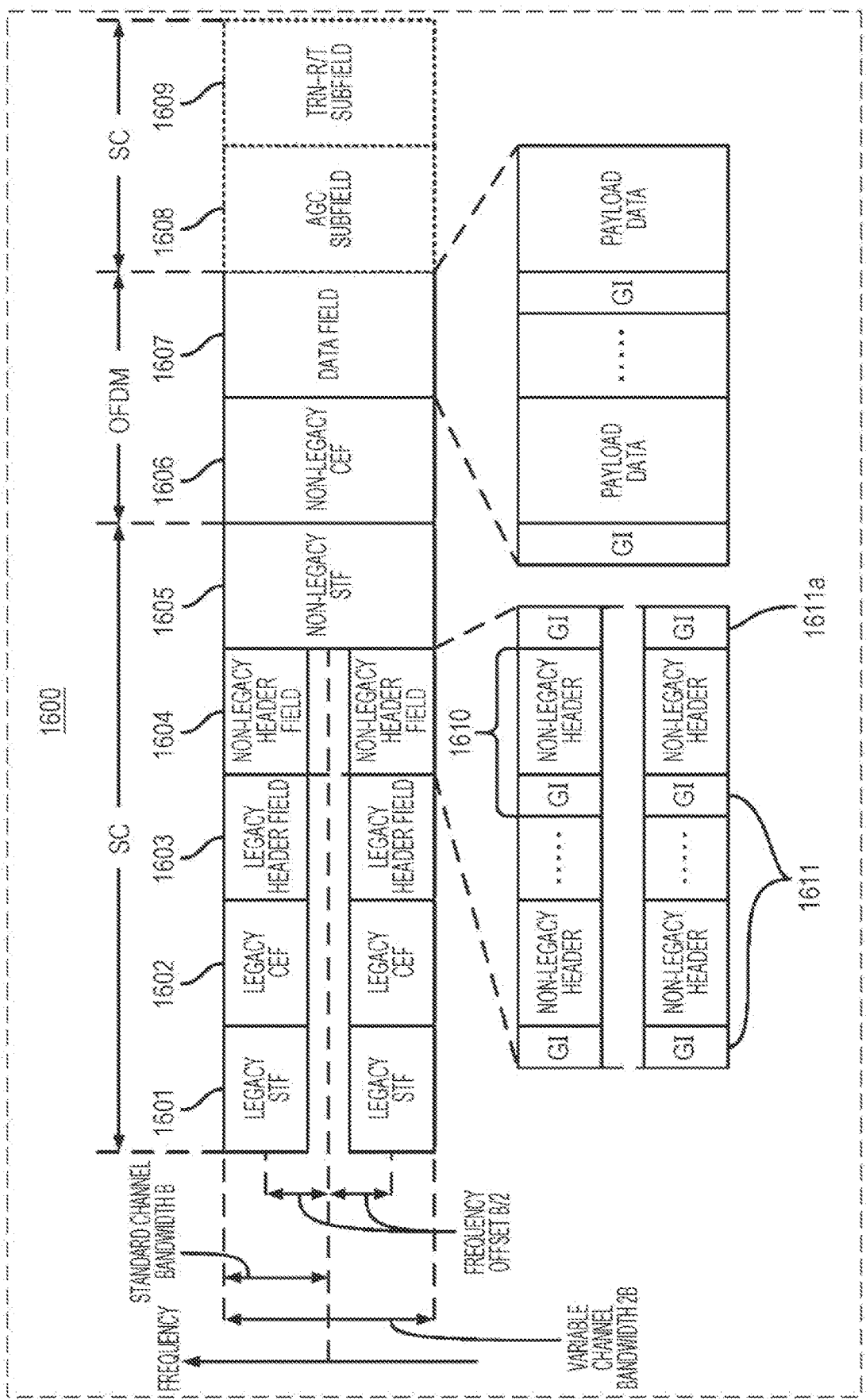
FIG. 16 is a diagram illustrating an example of the MF OFDM A-PPDU format transmitted at a variable channel bandwidth that is twice the standard channel band width according to the present disclosure.

FIG. 16 is a diagram illustrating an example of the format of an MF OFDM PPDU 1600 transmitted at a variable channel bandwidth that is double the standard channel bandwidth B according to the present disclosure. The MF OFDM PPDU 1600 includes a legacy STF 1601, a legacy CEF 1602, a legacy header field 1603, a non-legacy header field 1604, a non-legacy STF 1605, a non-legacy CEF 1606, a data field 1607, an optional AGC subfield 1608, and an optional TRN-R/T 1609. Definitions of the legacy STF 1601, legacy CEF 1602, legacy header field 1603, non-legacy header field 1604, AGC subfield 1608, and TRN-R/T subfield 1609 are the same as the definitions of the corresponding fields of the MF OFDM PPDU 1500 in FIG. 15, so description will be omitted.

The channel bandwidth differs among the data field 1607, legacy STF 1601, and legacy CEF 1602, so the non-legacy STF 1605 and non-legacy CEF 1606 are present in the MF OFDM PPDU 1600. Accordingly, a GI 1611a is added to the end of the final SC block 1610 of the non-legacy header field 1604.

In FIG. 16, the legacy STF 1601, legacy CEF 1602, legacy header field 1603, and non-legacy header field 1604 are duplicated, and transmitted by the standard channel bandwidth B (i.e., 2.16 GHz), each with a frequency offset B/2 that is half band of the standard channel bandwidth B (i.e., 1.08 GHz). On the other hand, the non-legacy STF 1605, non-legacy CEF 1606, data field 1607, AGC subfield 1608, and TRN-R/T subfield 1609 are transmitted at the variable channel bandwidth 2B that is a band double the standard channel bandwidth B (i.e., 4.32 GHz). Accordingly, sampling rate conversion processing is performed at the boundary between the non-legacy header field 1604 and non-legacy STF 1605.

Also, the legacy STF 1601, legacy CEF 1602, legacy header field 1603, non-legacy header field 1604, non-legacy STF 1605, AGC subfield 1608, and TRN-R/T 1609 are transmitted by SC modulation, while the non-legacy CEF 1606 and data field 1607 are transmitted by OFDM modulation. Accordingly, sampling rate conversion processing is performed at the boundary between the non-legacy STF 1605 and non-legacy CEF 1606, and at the boundary between the data field 1607 and AGC subfield 1608.

Figure 17:
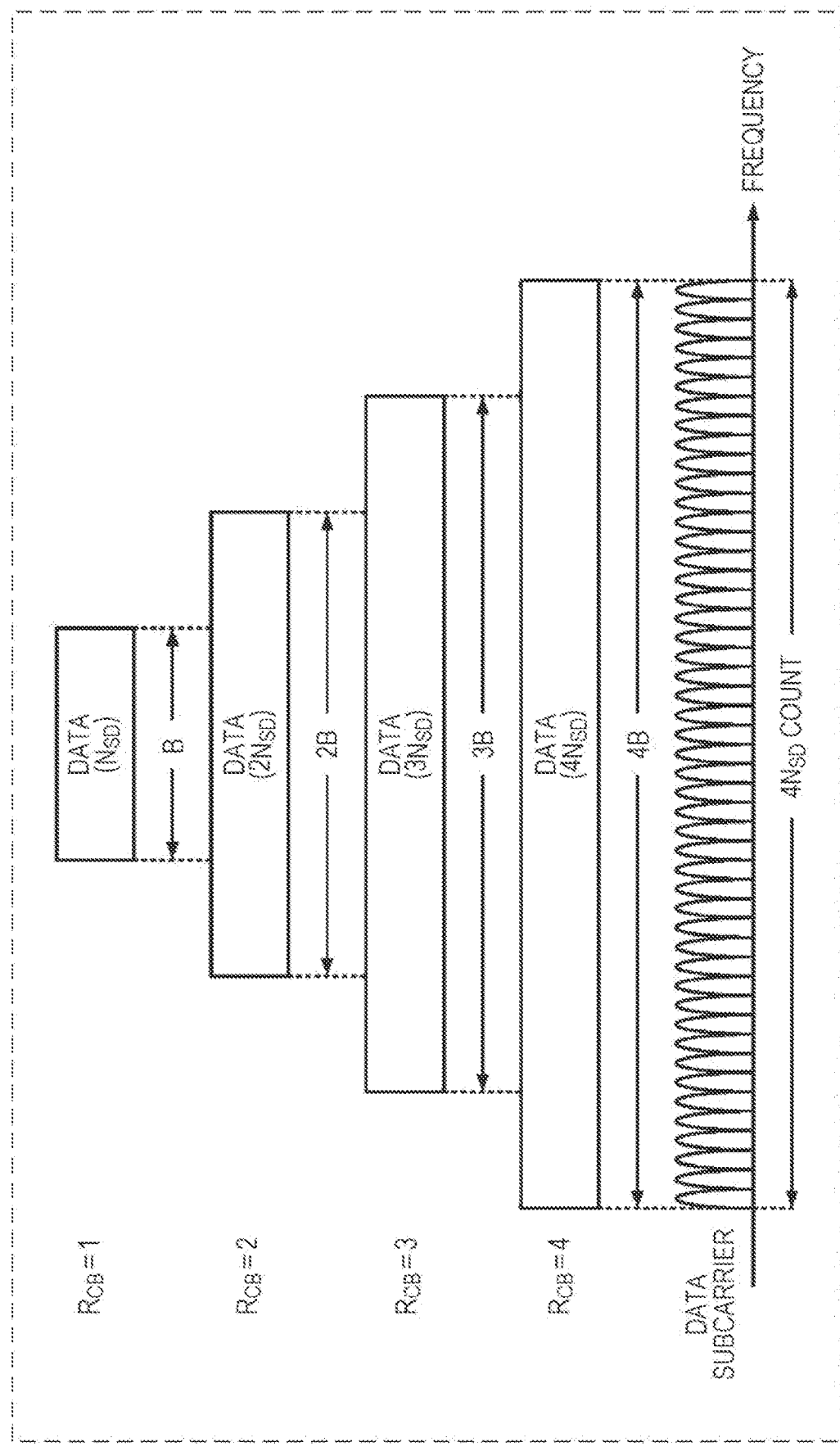
FIG. 17 is a diagram illustrating an example of subcarrier mapping with regard to a data field of an MF OFDM PPDU according to the present disclosure.

FIG. 17 is a diagram illustrating an example of subcarrier mapping in the data fields 1507 and 1607 of the MF OFDM PPDU 1500 and 1600 according to the present disclosure. Illustrated in FIG. 17 are a data subcarrier count $N_{SD}$ (payload data symbol count) when the standard channel bandwidth B is used, and ratio of standard channel bandwidth and variable channel bandwidth (i.e., variable channel bandwidth/standard channel bandwidth) $R_{CB}$.

Although data subcarriers are illustrated in FIG. 17 for the sake of simplicity, DC subcarrier, pilot subcarrier, and guard band are also present in an actual MF OFDM PPDU. In FIG. 17, the data subcarrier count increases proportionately to $R_{CB}$ in the MF OFDM PPDU, so the symbol count of payload data to be mapped to data subcarriers also increases proportionately to $R_{CB}$.

Figure 18:
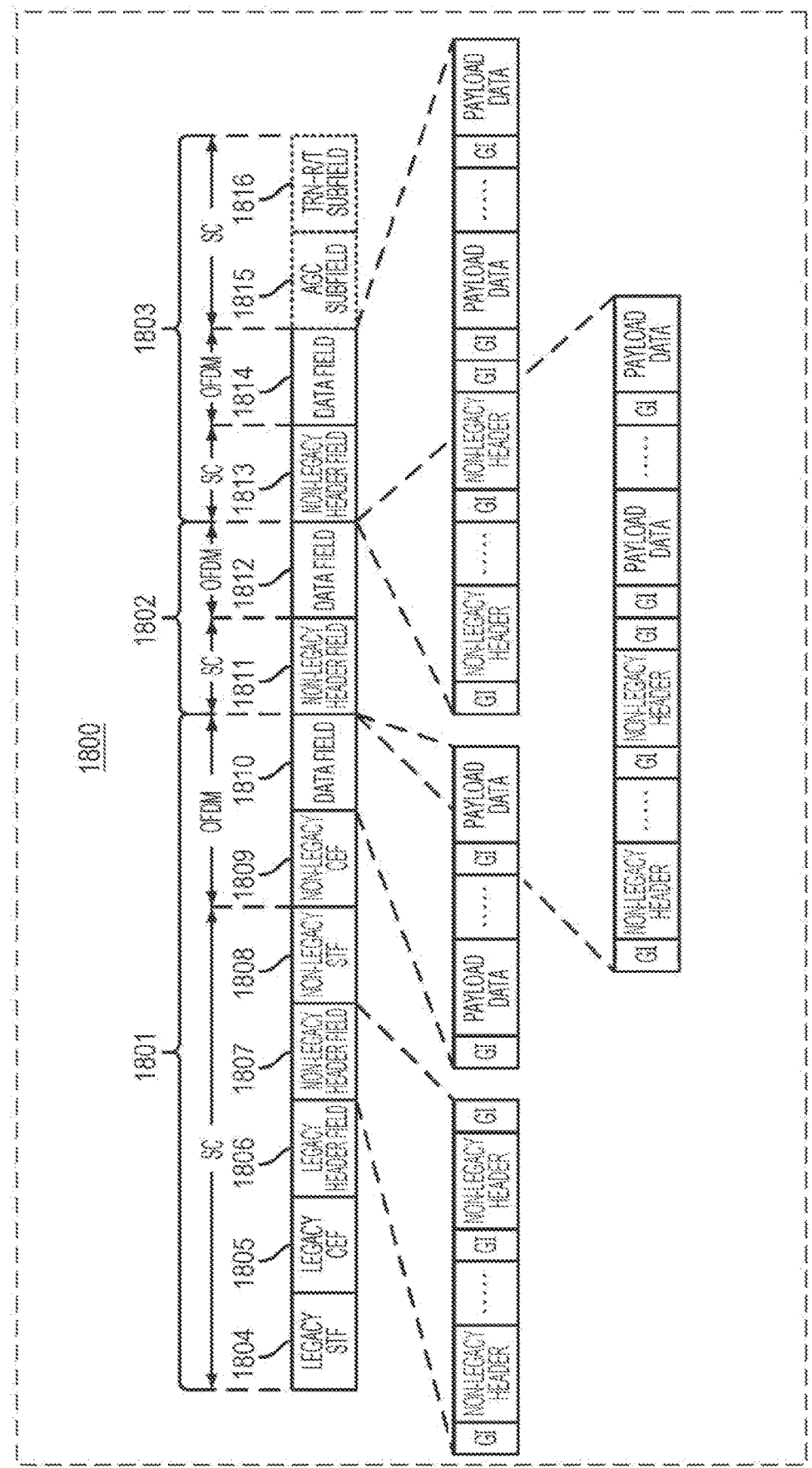
FIG. 18 is a diagram illustrating an example of the MF OFDM A-PPDU format transmitted at the standard channel bandwidth according to the present disclosure.

FIG. 18 is a diagram illustrating an example of the format of an MF OFDM A-PPDU 1800 transmitted at the standard channel bandwidth according to the present disclosure. The MF OFDM A-PPDU 1800 is made up of three MF OFDM PPDUs 1801, 1802, and 1803. The MF OFDM PPDUs are linked without an IFS or preamble therebetween, and include non-legacy header fields and data fields.

For example, the MF OFDM PPDU 1801 disposed at the start of the MF OFDM A-PPDU 1800 includes a non-legacy header field 1807, data field 1810, legacy STF 1804, legacy CEF 1805, legacy header field 1806, non-legacy STF 1808, and non-legacy CEF 1809. Note that in a case where the data fields 1810, 1812, and 1814 are transmitted using SISO, the non-legacy STF 1808 and non-legacy CEF 1809 may be omitted, since the AGC level adjusted at the legacy STF 1804 and channel estimation results obtained at the legacy CEF 1805 can be used in the data fields 1810, 1812, and 1814.

The MF OFDM PPDU 1803 disposed at the end of the MF OFDM A-PPDU 1800 includes a non-legacy header field 1807, a data field 1810, an optional AGC subfield 1815, and an optional TRN-R/T 1816. Definitions of the legacy STF 1804, legacy CEF 1805, legacy header field 1806, non-legacy header fields 1807, 1811, and 1813, non-legacy STF 1808, non-legacy CEF 1809, AGC subfield 1815, and TRN-R/T subfield 1816 of the MF OFDM A-PPDU 1800 are the same as the definitions of the corresponding fields of the MF OFDM PPDU 1500 in FIG. 15, so description will be omitted.

The MF OFDM PPDU 1803 is not followed by another MF OFDM PPDU, so the Additional PPDU field of the non-legacy header field 1813 of the MF OFDM PPDU 1803 is set to 0, while the MF SC PPDUs 1801 and 1802 are followed by another MF OFDM PPDU, so the Additional PPDU field of the non-legacy header fields 1807 and 1811 are set to 1. Note that the Additional PPDU field in the legacy header included in the legacy header field 1806 is set to 0, so that the MF OFDM A-PPDU 1800 will be received as a conventional LF OFDM PPDU by a legacy device.

In FIG. 18, all fields of the MF OFDM A-PPDU 1800 are transmitted using the 2.16 GHz standard channel bandwidth. Also, the legacy STF 1804, legacy CEF 1805, legacy header field 1806, non-legacy header fields 1807, 1811, and 1813, non-legacy STF 1808, AGC subfield 1815, and TRN-R/T subfield 1816 are transmitted by SC modulation, while the non-legacy CEF 1809 and data fields 1810, 1812, and 1814 are transmitted by OFDM modulation.

Accordingly, sampling rate conversion processing is performed at the boundary between the data field 1810 and the non-legacy header field 1811, at the boundary between the non-legacy header field 1811 and the data field 1812, at the boundary between the data field 1812 and the non-legacy header field 1813, and at the boundary between the non-legacy header field 1813 and the data field 1814.

Figure 19:
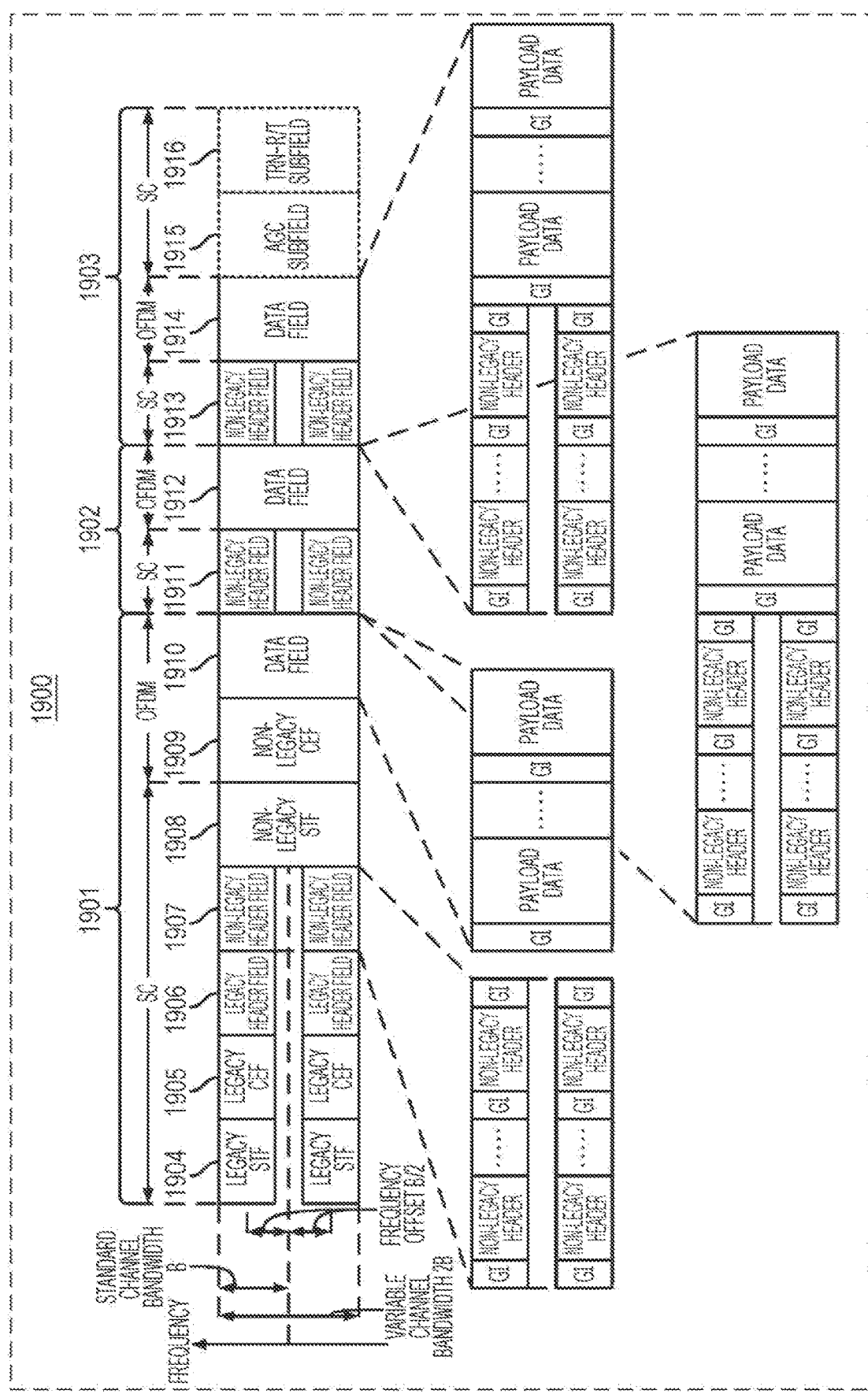
FIG. 19 is a diagram illustrating an example of the MF OFDM A-PPDU format transmitted at a variable channel bandwidth that is twice the standard channel band width according to the present disclosure.

FIG. 19 is a diagram illustrating an example of the format of an MF OFDM A-PPDU 1900 transmitted at the variable channel bandwidth that is double the standard channel bandwidth B, according to the present disclosure.

The MF OFDM A-PPDU 1900 is made up of three MF OFDM PPDUs 1901, 1902, and 1903. The MF OFDM PPDUs are linked without an IFS or preamble therebetween, and include non-legacy header fields and data fields. For example, the MF OFDM PPDU 1901 disposed at the start of the MF OFDM A-PPDU 1900 includes a non-legacy header field 1907, data field 1910, legacy STF 1904, legacy CEF 1905, legacy header field 1906, non-legacy STF 1908, and non-legacy CEF 1909.

The MF OFDM PPDU 1903 disposed at the end of the MF OFDM A-PPDU 1900 includes a non-legacy header field 1913, a data field 1914, an optional AGC subfield 1915, and an optional TRN-R/T 1916. Definitions of the legacy STF 1904, legacy CEF 1905, legacy header field 1906, non-legacy header fields 1907, 1911, and 1913, non-legacy STF 1908, non-legacy CEF 1909, AGC subfield 1915, and TRN-R/T subfield 1916 are the same as the definitions of the corresponding fields of the MF OFDM PPDU 1600 in FIG. 16, so description will be omitted.

The MF OFDM PPDU 1903 is not followed by another MF OFDM PPDU, so the Additional PPDU field of the non-legacy header field 1913 of the MF OFDM PPDU 1903 is set to 0, while the MF OFDM PPDUs 1901 and 1902 are followed by other MF OFDM PPDUs 1902 and 1903, so the Additional PPDU field of the non-legacy header fields 1907 and 1911 are set to 1. Note that the Additional PPDU field of the legacy header included in the legacy header field 1906 is set to 0, so that the MF OFDM A-PPDU 1900 will be received as a conventional LF OFDM PPDU by a legacy device.

In FIG. 19, the legacy STF 1904, legacy CEF 1905, legacy header field 1906, and non-legacy header fields 1907, 1911, and 1913 are duplicated, and transmitted by the standard channel bandwidth B (i.e., 2.16 GHz), each with a frequency offset B/2 that is half band of the standard channel bandwidth B (i.e., 1.08 GHz). On the other hand, the non-legacy STF 1908, non-legacy CEF 1909, data fields 1910, 1912, and 1914, AGC subfield 1915, and TRN-R/T subfield 1916 are transmitted at the variable channel bandwidth 2B that is a band double the standard channel bandwidth B (i.e., 4.32 GHz).

Also, the legacy STF 1904, legacy CEF 1905, legacy header field 1906, non-legacy header fields 1907, 1911, and 1913, non-legacy STF 1908, AGC subfield 1915, and TRN-R/T subfield 1916 are transmitted by SC modulation, while the non-legacy CEF 1909 and data fields 1910, 1912, and 1914 are transmitted by OFDM modulation.

Accordingly, sampling rate conversion processing is performed at the boundary between the data field 1910 and the non-legacy header field 1911, at the boundary between the non-legacy header field 1911 and the data field 1912, at the boundary between the data field 1912 and the non-legacy header field 1913, and at the boundary between the non-legacy header field 1913 and the data field 1914.

First Embodiment

Figure 20:
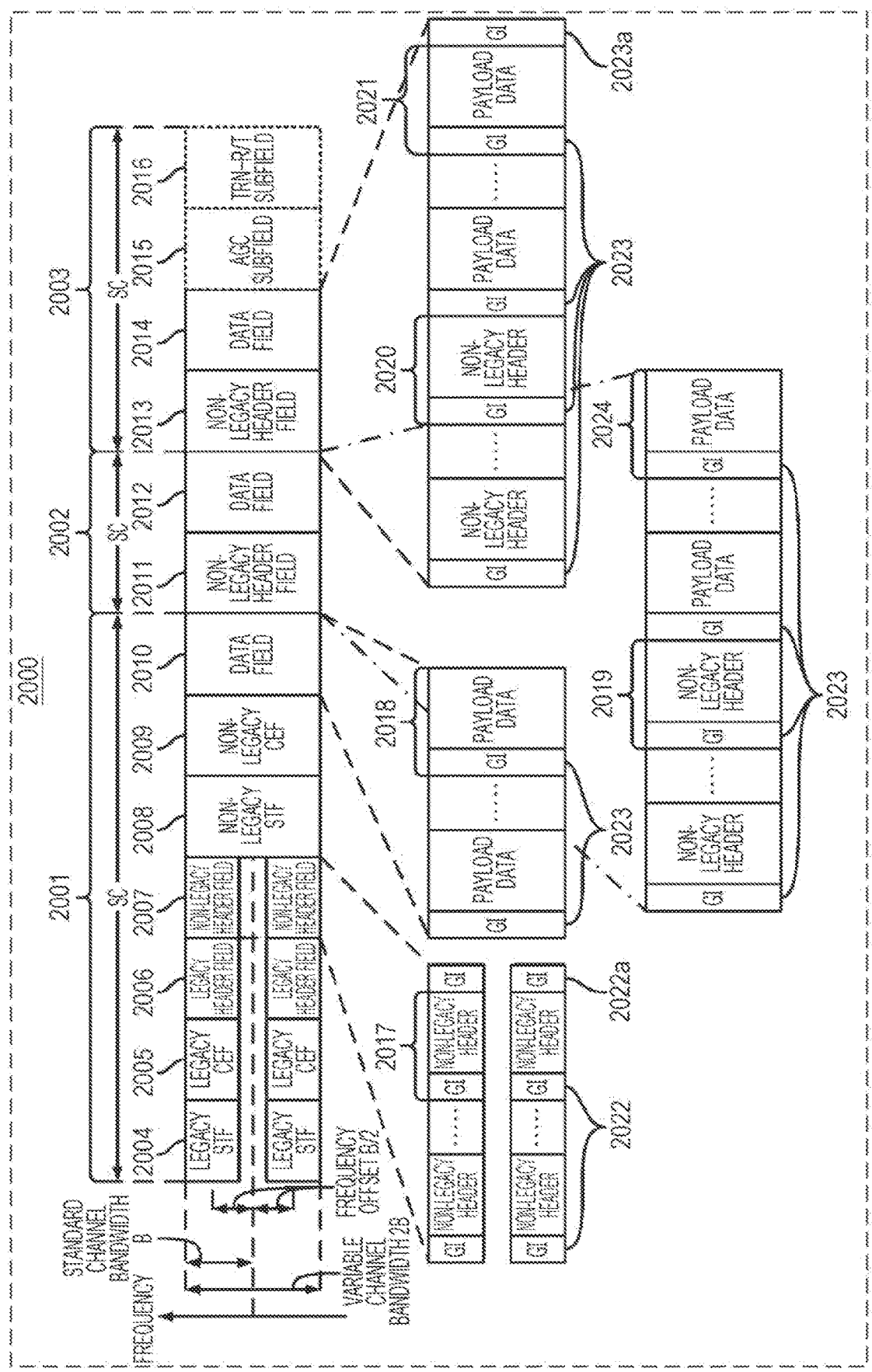
FIG. 20 is a diagram illustrating an example of the MF SC A-PPDU format transmitted at a variable channel bandwidth that is twice the standard channel band width according to a first embodiment of the present disclosure.

FIG. 20 is a diagram illustrating an example of the format of an MF SC A-PPDU 2000 transmitted at the variable channel bandwidth that is double the standard channel bandwidth, according to a first embodiment of the present disclosure. The MF SC A-PPDU 2000 is made up of three MF SC PPDUs 2001, 2002, and 2003. The MF SC PPDUs are linked without an IFS or preamble therebetween, and include non-legacy header fields and data fields. The data fields include at least one of audio, video, and data.

For example, the MF SC PPDU 2001 disposed at the start of the MF SC A-PPDU 2000 includes a non-legacy header field 2007, data field 2010, legacy STF 2004, legacy CEF 2005, legacy header field 2006, non-legacy STF 2008, and non-legacy CEF 2009. The MF SC PPDU 2003 disposed at the end of the MF SC A-PPDU 2000 includes a non-legacy header field 2013, a data field 2014, an optional AGC subfield 2015, and an optional TRN-R/T subfield 2016. Definitions of the legacy STF 2004, legacy CEF 2005, legacy header field 2006, non-legacy STF 2008, non-legacy CEF 2009, AGC subfield 2015, and TRN-R/T subfield 2016 are the same as the definitions of the corresponding fields of the MF SC A-PPDU 1400 in FIG. 14, so description will be omitted.

The difference between the MF SC A-PPDU 1400 in FIG. 14 and the MF SC A-PPDU 2000 in FIG. 20 will be described below. In FIG. 20, the non-legacy header field of the MF SC PPDU 2001 disposed at the start is transmitted by the standard channel bandwidth B, and the non-legacy header fields 2011 and 2013 of the MF SC PPDUs 2002 and 2003 disposed at the second sequential order and thereafter are transmitted by the variable channel bandwidth 2B.

That is to say, in FIG. 20 the non-legacy header field 2007 is duplicated, and each is transmitted by the standard channel bandwidth B (i.e., 2.16 GHz), each with a frequency offset B/2 that is half band of the standard channel bandwidth B (i.e., 1.08 GHz), but the non-legacy header fields 2011 and 2013 are transmitted at the variable channel bandwidth 2B that is a band double the standard channel bandwidth B (i.e., 4.32 GHz). Accordingly, a GI 2022a is added to the end of the final SC block 2017 of the non-legacy header field 2007, but no GI 2023a is added to the end of the final SC blocks 2019 and 2020 of the non-legacy header fields 2011 and 2013.

Figure 21:
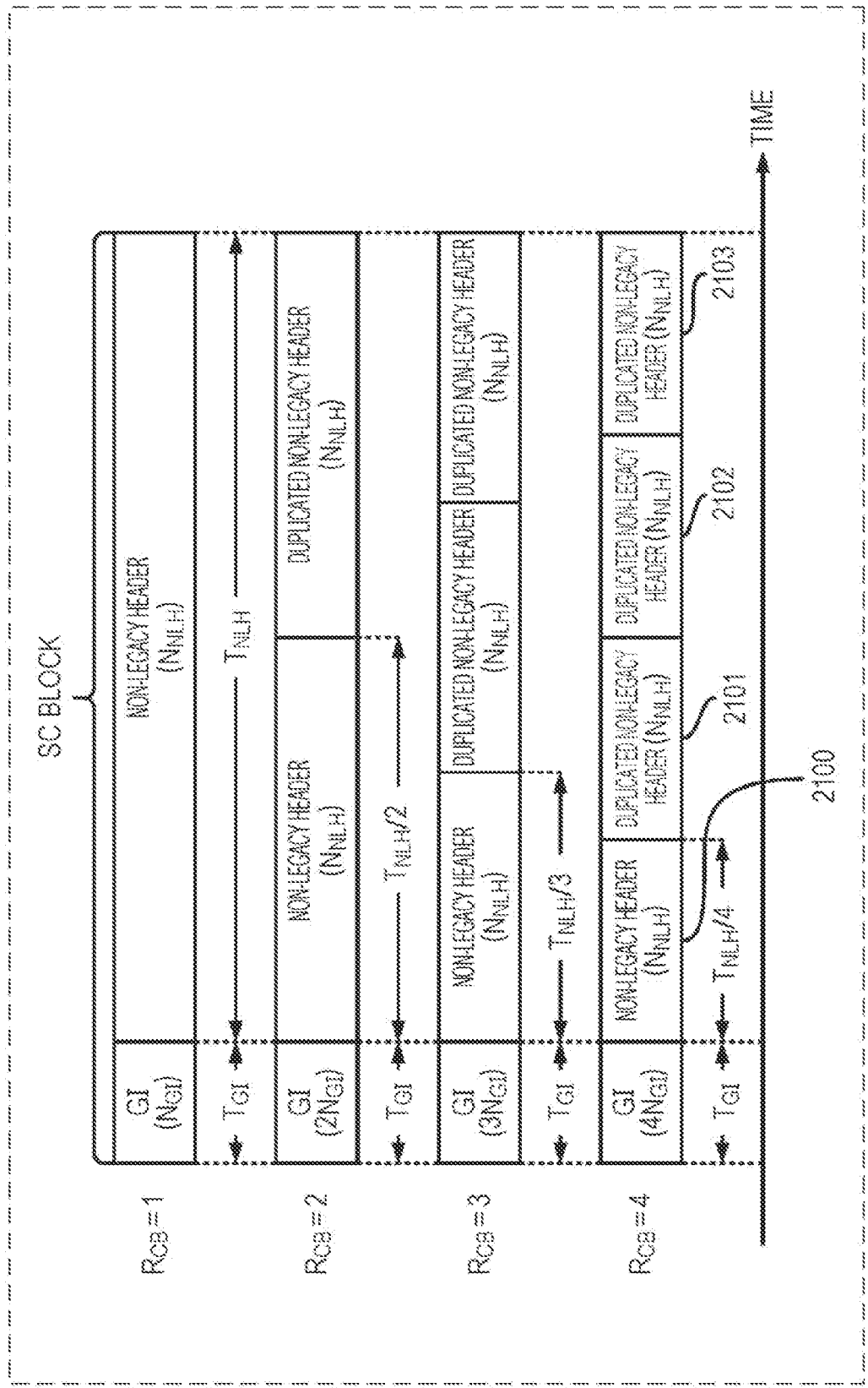
FIG. 21 is a diagram illustrating an example of detailed configuration of an SC block in a non-legacy header field of an MF SC A-PPDU according to the first embodiment of the present disclosure.

FIG. 21 is a diagram illustrating an example of a detailed configuration of an SC block in a non-legacy header field according to the first embodiment of the present disclosure. Illustrated in FIG. 21 are a symbol count $N_{GI}$ of a GI when using the standard channel bandwidth, a symbol count $N_{NLH}$ of non-legacy header per SC block when using the standard channel bandwidth, GI period $T_{GI}$, non-legacy header period $T_{NLH}$, and ratio of standard channel bandwidth and variable channel bandwidth (i.e., variable channel bandwidth/standard channel bandwidth) $R_{CB}$.

Accordingly, $R_{CB}=1$ is equivalent to the SC block configuration of the non-legacy header field 2007 in FIG. 20, while $R_{CB}=2$ is equivalent to the SC block configuration of the non-legacy header fields 2011 and 2013 in FIG. 20. $R_{CB}=4$ includes the non-legacy header 2100, duplicated non-legacy header 2101, duplicated non-legacy header 2102, and duplicated non-legacy header 2103.

It is demanded in FIG. 21 to maintain the GI period to $T_{GI}$ regardless of the $R_{CB}$, and keep the ratio between the GI period $T_{GI}$ and the non-legacy header period constant with regard to the non-legacy header field as well, in order to maintain interference avoidance capabilities regarding multipath delay waves and transmission efficiency, in the same way as in FIG. 12. However, unlike the case of a data field, the bit count of a non-legacy header is fixed, so increasing the symbol count in proportion to the $R_{CB}$ is difficult. Accordingly, the non-legacy header period $T_{NLH}$ can be maintained constant by duplicating an $R_{CB}$ count of non-legacy headers and disposing these in a single SC block. The configuration of the GI is the same as that illustrated in FIG. 12. Thus, the ratio between the GI period and non-legacy header period in an SC block of a non-legacy header field (i.e., $T_{GI}/T_{NLH}$) is maintained constant.

Figure 22:
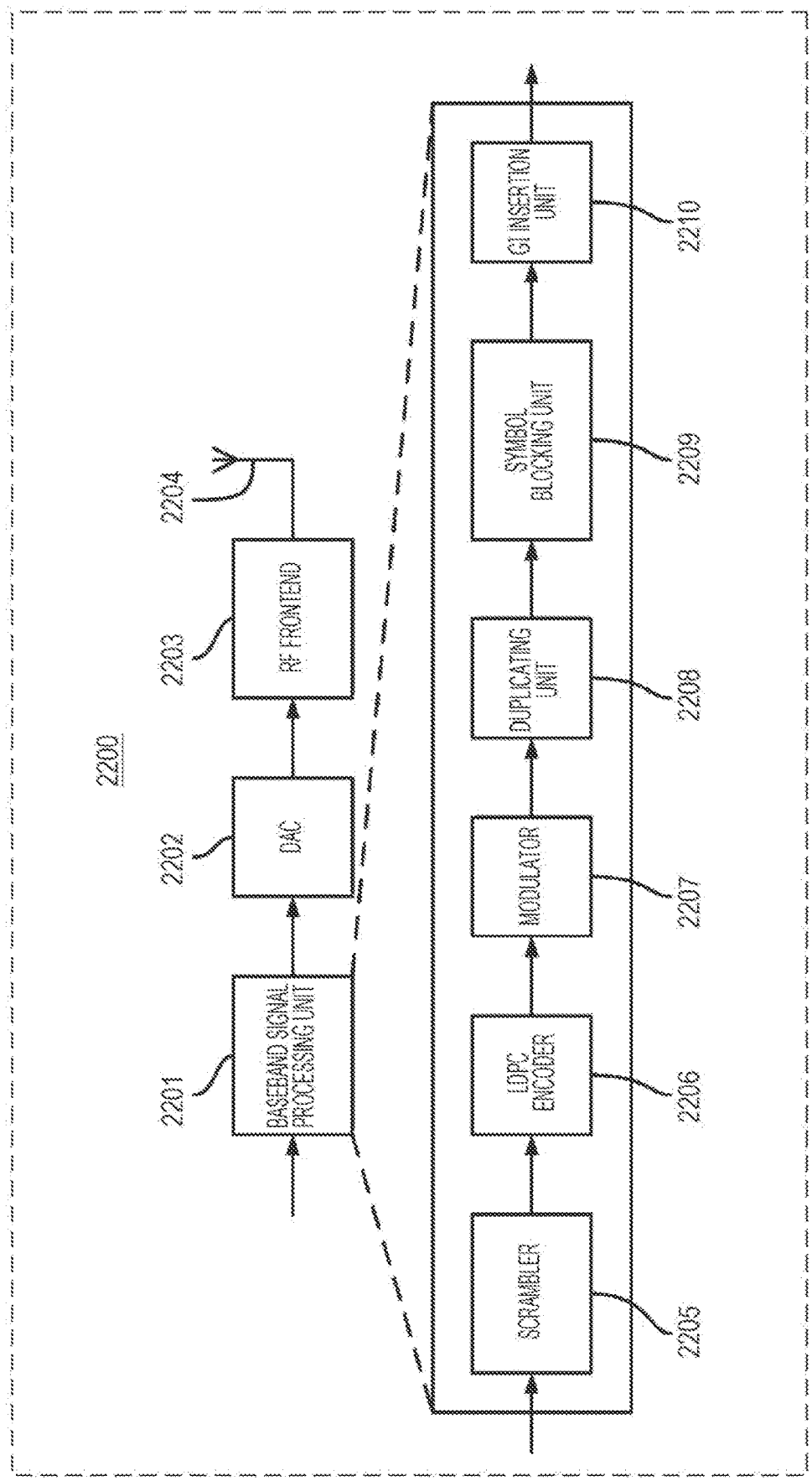
FIG. 22 is a diagram illustrating an example of the configuration of an MF SC A-PPDU transmission device according to the first embodiment of the present disclosure.

FIG. 22 is a diagram illustrating an example of the configuration of an MF SC A-PPDU transmission device 2200 according to the first embodiment of the present disclosure. The transmission device 2200 has a baseband signal processing unit 2201, a DAC 2202, an RF frontend 2203, and an antenna 2204. The baseband signal processing unit 2201 further includes a scrambler 2205, an LDPC encoder 2206, a modulator 2207, a duplicating unit 2208, a symbol blocking unit 2209, and a GI insertion unit 2210. The transmission device 2200 has the same configuration as the transmission device 300 except for the duplicating unit 2208, symbol blocking unit 2209, and GI insertion unit 2210, so description will be omitted.

Figure 23:
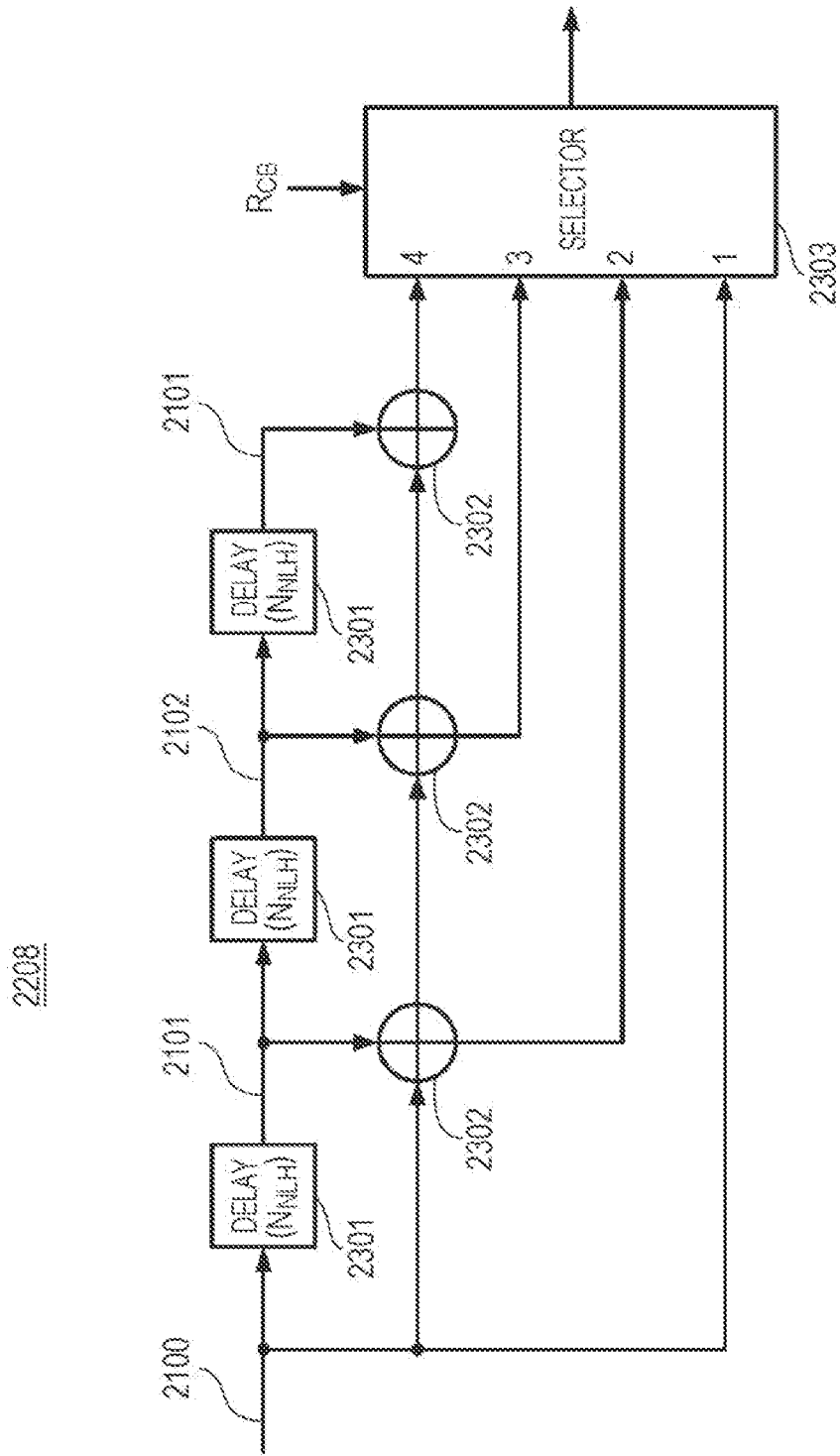
FIG. 23 is a diagram illustrating an example of the configuration of a duplicating unit according to the first embodiment of the present disclosure.

The configuration in FIG. 23, for example, may be used when the duplicating unit 2208 duplicates the non-legacy header 2100. FIG. 23 includes delays 2301, compositors 2302, and a selector 2303, and can handle up to $R_{CB}=4$. As illustrated in FIG. 21, an ($R_{CB}-1$) count of non-legacy headers is duplicated in the SC block, and linked with a time difference of $N_{NLH}$ symbols, so the duplicating unit 2208 generates three duplicated non-legacy headers 2101, 2102, and 2103 with delays of $1\times N_{NLH}$ symbols, $2\times N_{NLH}$ symbols, and $3\times N_{NLH}$ symbols, as to the non-legacy header 2100, and the non-legacy header 2100 that has been provided as input signals is composited with the duplicated non-legacy headers 2101, 2102, and 2103.

The selector 2303 allows composited signals to pass, in accordance with the input $R_{CB}$. For example, if $R_{CB}=2$, the selector 2303 selects input signals of port 2. Signals of port 2 are the composited symbols of the non-legacy header 2100 and the duplicated non-legacy header 2101 delayed by $N_{NLH}$ symbols, and accordingly is equivalent to the configuration of $R_{CB}=2$ in FIG. 21.

If $R_{CB}=4$, the selector 2303 selects input signals of port 4. Signals of port 4 are the composited symbols of the non-legacy header 2100, the duplicated non-legacy header 2101 delayed by $1\times N_{NLH}$ symbols, the duplicated non-legacy header 2102 delayed by $2\times N_{NLH}$ symbols, and the duplicated non-legacy header 2103 delayed by $3\times N_{NLH}$ symbols, and accordingly is equivalent to the configuration of $R_{CB}=4$ in FIG. 21.

The symbol blocking unit 2209 generates symbol blocks in increments of an $R_{CB}\times N_{NLH}$ count with regard to the non-legacy header fields 2007, 2011, and 2013, and generates symbol blocks in increments of an $R_{CB}\times N_D$ count with regard to the data fields 2010, 2012, and 2014. The GI insertion unit 2210 adds a GI of $R_{CB}\times N_{GI}$ symbols to the start of the symbol block, thereby generating an SC block. Note that the order of the modulator 2207 and the duplicating unit 2208 may be reversed.

According to the present first embodiment, the non-legacy header fields 2011 and 2013 and the data fields 2010, 2012, and 2014 are transmitted by the same channel bandwidth, with the exception of the non-legacy header field 2007 of the MF SC PPDU 2001 disposed at the start, so adding of the GI 2022a to the end of the final SC blocks 2019 and 2020 of the non-legacy header fields 2011 and 2013 can be omitted, and also adding of the GI 2023a to the end of the final SC blocks 2018 and 2024 of the data fields 2010 and 2012 can be omitted with the exception of the data field 2014 of the MF SC PPDU 2003 disposed at the end. Note that the GI 2023a may be added to the ends of the data fields 2010, 2012, and 2014.

Accordingly, transmission efficiency can be improved as compared to the MF SC A-PPDU 1400 illustrated in FIG. 14. Also, sampling rate conversion processing becomes unnecessary at the boundary between the data field 2010 and non-legacy header field 2011, at the boundary between the non-legacy header field 2011 and the data field 2012, at the boundary between the data field 2012 and the non-legacy header field 2013, and at the boundary between the non-legacy header field 2013 and the data field 2014, so consumption of electric power can be reduced.

Second Embodiment

Figure 24:
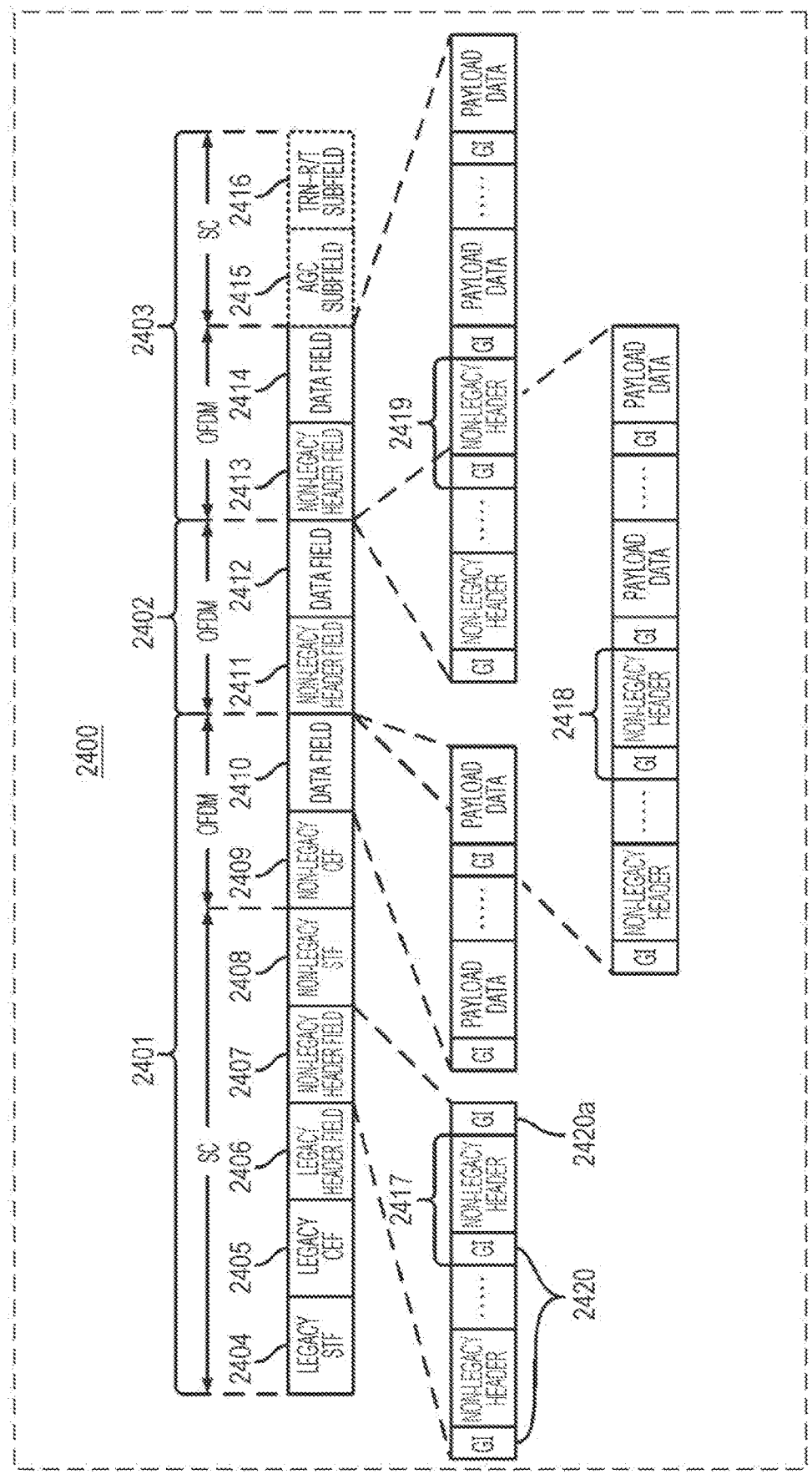
FIG. 24 is a diagram illustrating an example of the MF OFDM PPDU format transmitted at the standard channel bandwidth according to a second embodiment of the present disclosure.

FIG. 24 is a diagram illustrating an example of the format of an MF OFDM A-PPDU 2400 transmitted at the standard channel bandwidth, according to a second embodiment of the present disclosure. The MF OFDM A-PPDU 2400 is made up of three MF OFDM PPDUs 2401, 2402, and 2403. The MF OFDM PPDUs are linked without an IFS or preamble therebetween, and include non-legacy header fields and data fields.

For example, the MF OFDM PPDU 2401 disposed at the start of the MF OFDM A-PPDU 2400 includes a non-legacy header field 2407, data field 2410, legacy STF 2404, legacy CEF 2405, legacy header field 2406, non-legacy STF 2408, and non-legacy CEF 2409. Note that in a case where the data fields 2410, 2412, and 2414 are transmitted using SISO, the non-legacy STF 2408 and non-legacy CEF 2409 may be omitted, since the AGC level adjusted at the legacy STF 2404 and channel estimation results obtained at the legacy CEF 2405 can be used in the data fields 2410, 2412, and 2414.

The MF OFDM PPDU 2403 disposed at the end of the MF OFDM A-PPDU 2400 includes a non-legacy header field 2413, a data field 2414, an optional AGC subfield 2415, and an optional TRN-R/T subfield 2416. Definitions of the legacy STF 2404, legacy CEF 2405, legacy header field 2406, legacy header field 2406, non-legacy STF 2408, AGC subfield 2415, and TRN-R/T subfield 2416, of the MF OFDM A-PPDU 2400, are the same as the definitions of the corresponding fields of the MF OFDM PPDU 1800 in FIG. 18, so description will be omitted.

The difference between the MF OFDM A-PPDU 1800 in FIG. 18 and the MF OFDM A-PPDU 2400 in FIG. 24 will be described below. In FIG. 24, the non-legacy header field 2407 of the MF OFDM PPDU 2401 disposed at the start is transmitted by SC modulation, but the non-legacy header fields 2411 and 2413 of the MF OFDM PPDU 2402 and 2403 disposed at the second sequential order and thereafter are transmitted by OFDM modulation.

Accordingly, a GI 2420a is added to the end of the final SC block 2417 of the non-legacy header field 2407, but adding the GI 2420a to the ends of the final OFDM symbols 2418 and 2419 of the non-legacy header fields 2411 and 2413 can be omitted. Also, sampling rate conversion processing can be omitted at the boundary between the data field 2410 and non-legacy header field 2411, between the non-legacy header field 2411 and the data field 2412, between the data field 2412 and the non-legacy header field 2413, and at the boundary between the non-legacy header field 2413 and the data field 2414.

Figure 25:
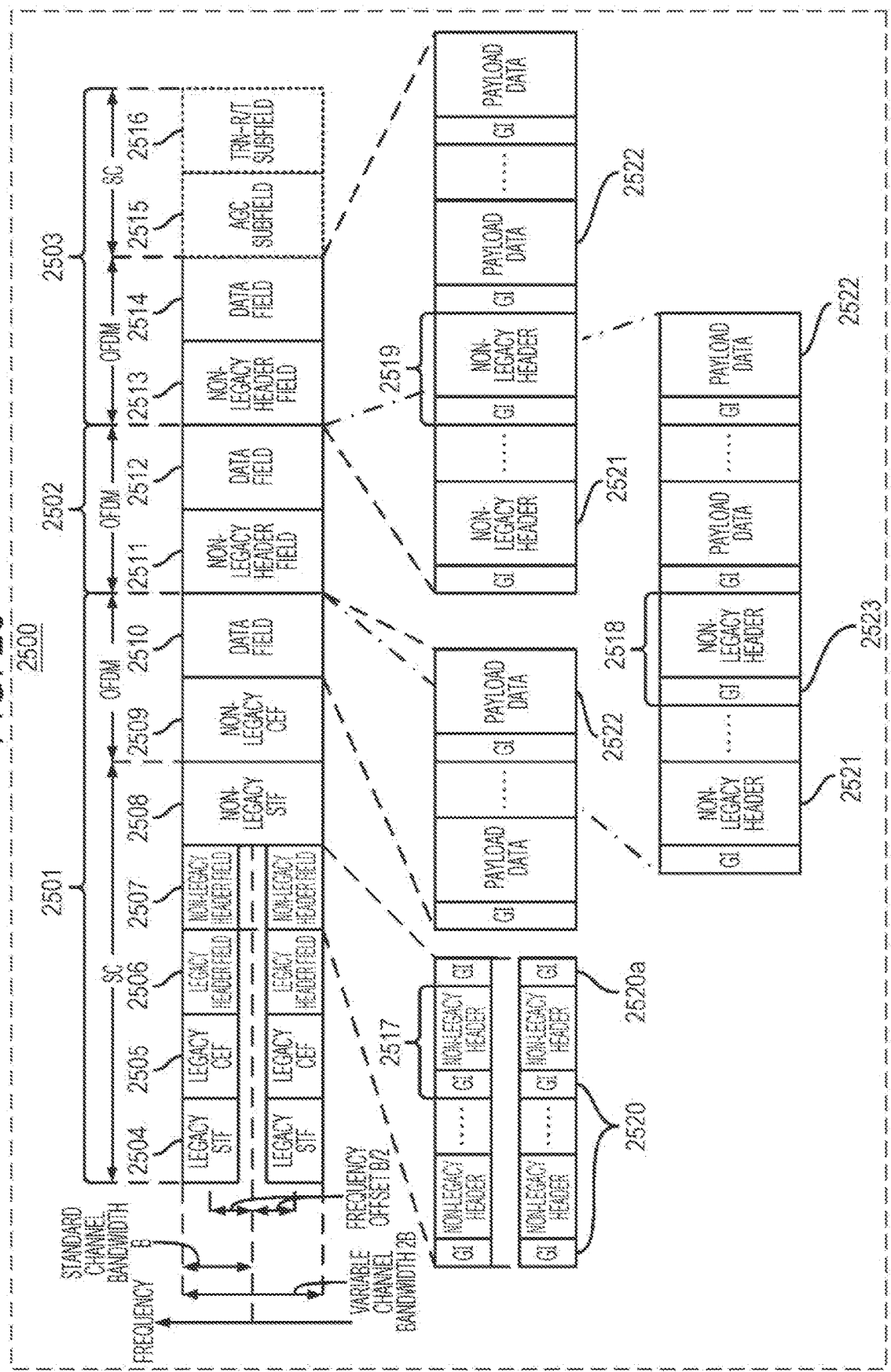
FIG. 25 is a diagram illustrating an example of the MF OFDM A-PPDU format transmitted at a variable channel bandwidth that is twice the standard channel band width according to the second embodiment of the present disclosure.

FIG. 25 is a diagram illustrating an example of the format of an MF OFDM A-PPDU 2500 transmitted at the variable channel bandwidth that is double the standard channel bandwidth, according to the second embodiment of the present disclosure. The MF OFDM A-PPDU 2500 is made up of three MF OFDM PPDUs 2501, 2502, and 2503. The MF OFDM PPDUs are linked without an IFS or preamble therebetween, and include non-legacy header fields and data fields. For example, the MF OFDM PPDU 2501 disposed at the start of the MF OFDM A-PPDU 2500 includes a non-legacy header field 2507, data field 2510, legacy STF 2504, legacy CEF 2505, legacy header field 2506, non-legacy STF 2508, and non-legacy CEF 2509.

The MF OFDM PPDU 2503 disposed at the end of the MF OFDM A-PPDU 2500 includes a non-legacy header field 2513, a data field 2514, an optional AGC subfield 2515, and an optional TRN-R/T subfield 2516. Definitions of the legacy STF 2504, legacy CEF 2505, legacy header field 2506, non-legacy STF 2508, non-legacy CEF 2509, data fields 2510, 2512, and 2514, AGC subfield 2515, and TRN-R/T subfield 2516 are the same as the definitions of the corresponding fields of the MF OFDM PPDU 1900 in FIG. 19, so description will be omitted.

The difference between the MF OFDM A-PPDU 1900 in FIG. 19 and the MF OFDM A-PPDU 2500 in FIG. 25 will be described below. In FIG. 25, the non-legacy header field 2507 of the MF OFDM PPDU 2501 disposed at the start is transmitted by SC modulation using the standard channel bandwidth, while the non-legacy header fields 2511 and 2513 of the MF OFDM PPDUs 2502 and 2503 disposed at the second sequential order and thereafter are transmitted by OFDM modulation using the variable channel bandwidth 2B that is double the standard channel bandwidth B.

That is to say, as illustrated in FIG. 25, the non-legacy header field 2507 is duplicated, and each is transmitted by SC modulation using the standard channel bandwidth B (i.e., 2.16 GHz), each with a frequency offset B/2 that is half band of the standard channel bandwidth B (i.e., 1.08 GHz), but the non-legacy header fields 2511 and 2513 are transmitted by OFDM modulation using the variable channel bandwidth 2B that is a band double the standard channel bandwidth B (i.e., 4.32 GHz).

Accordingly, a GI 2520a is added to the end of the final SC block 2517 of the non-legacy header field 2507, but adding the GI 2520a to the end of the final OFDM symbols 2518 and 2519 of the non-legacy header fields 2511 and 2513 can be omitted. Also, sampling rate conversion processing can be omitted at the boundary between the data field 2510 and non-legacy header field 2511, between the non-legacy header field 2511 and the data field 2512, between the data field 2512 and the non-legacy header field 2513, and at the boundary between the non-legacy header field 2513 and the data field 2514.

Figure 26:
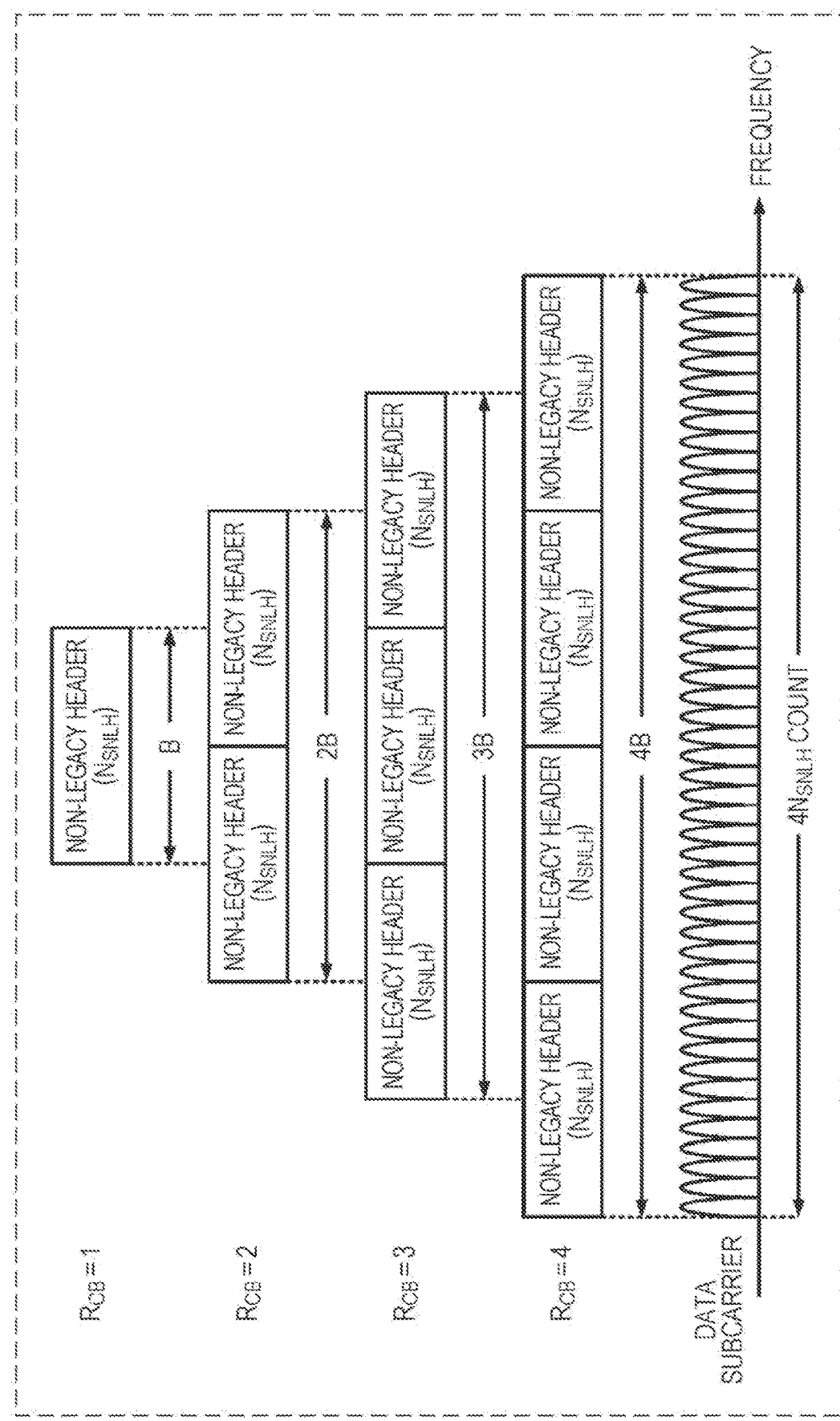
FIG. 26 is a diagram illustrating an example of subcarrier mapping with regard to a non-legacy header field of an MF OFDM PPDU according to the second embodiment of the present disclosure.

FIG. 26 is a diagram illustrating an example of subcarrier mapping at the non-legacy header fields 2711 and 2713 according to the second embodiment of the present disclosure. Illustrated in FIG. 26 are standard channel bandwidth B, a data subcarrier count $N_{SNLH}$ (symbol count of non-legacy header) when using the standard channel bandwidth B, and ratio of standard channel bandwidth and variable channel bandwidth (i.e., variable channel bandwidth/standard channel bandwidth) $R_{CB}$.

Although data subcarriers are illustrated in FIG. 26 for the sake of simplicity, DC subcarrier, pilot subcarrier, and guard band are also present in an actual MF OFDM PPDU. In FIG. 26, the data subcarrier count increases proportionately to $R_{CB}$ in the MF OFDM PPDU, so the symbol count of non-legacy headers to be mapped to data subcarriers also increases proportionately to $R_{CB}$. However, unlike the case of a data field, the bit count of a non-legacy header is fixed, so increasing the symbol count of a non-legacy header in proportion to the $R_{CB}$ is difficult. Accordingly, an $R_{CB}$ count of non-legacy headers is duplicated, and mapped to an $R_{CB} \times N_{SNLH}$ count of data subcarriers.

Figure 27:
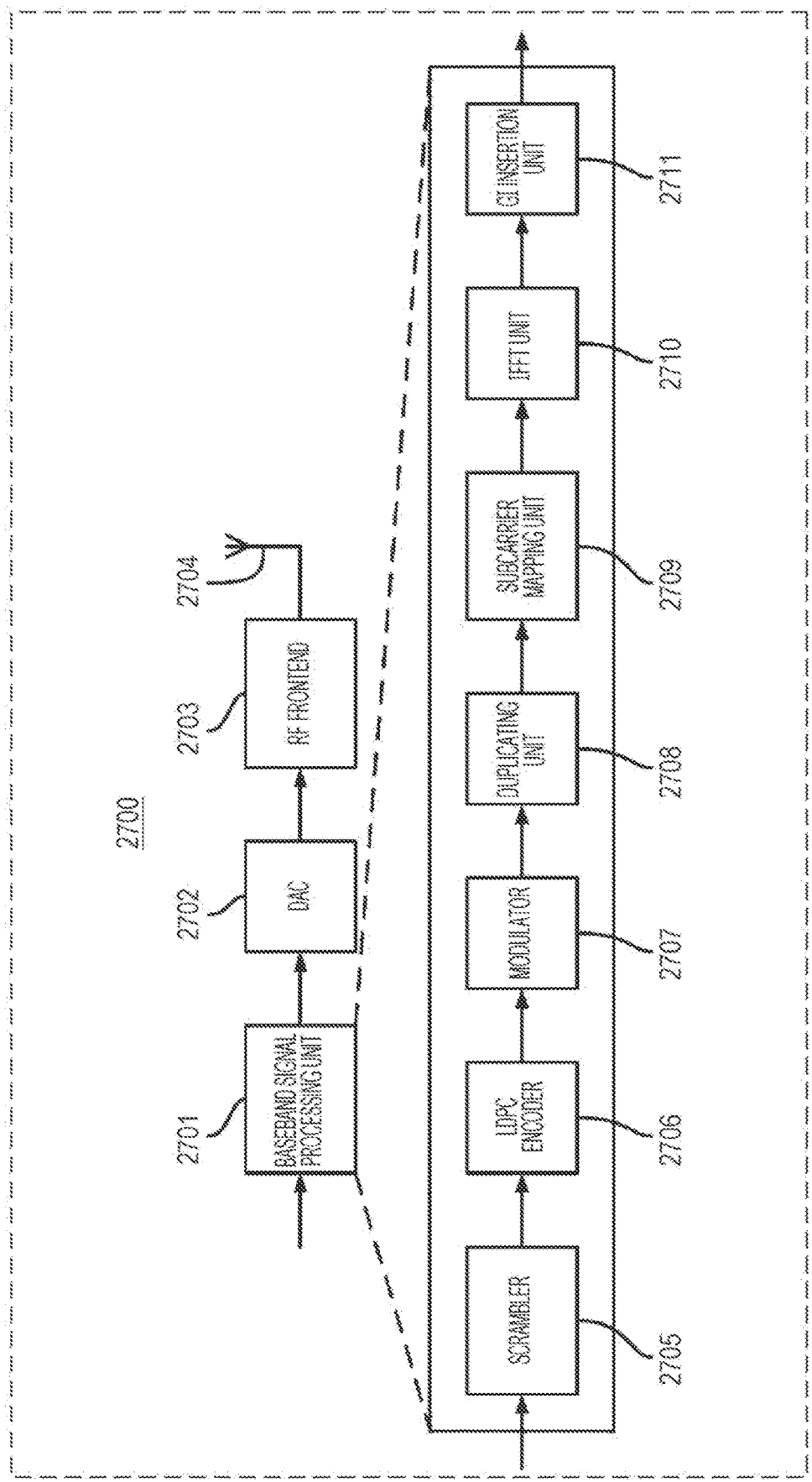
FIG. 27 is a diagram illustrating an example of the configuration of an MF OFDM A-PPDU transmission device according to the second embodiment of the present disclosure.

FIG. 27 is a diagram illustrating an example of the configuration of an MF OFDM A-PPDU transmission device 2700 according to the second embodiment of the present disclosure. The transmission device 2700 has a baseband signal processing unit 2701, a DAC 2702, an RF frontend 2703, and an antenna 2704. The baseband signal processing unit 2701 further includes a scrambler 2705, an LDPC encoder 2706, a modulator 2707, a duplicating unit 2708, a subcarrier mapping unit 2709, an IFFT unit 2710, and a GI insertion unit 2711.

The transmission device 2700 has the same configuration as the transmission device 700 except for the duplicating unit 2708, subcarrier mapping unit 2709, IFFT unit 2710, and GI insertion unit 2711, so description will be omitted. The duplicating unit 2708 duplicates an $R_{CB}$ count of the non-legacy header. The subcarrier mapping unit 2709 maps non-legacy header 2521 in increments of an $R_{CB} \times N_{SNLH}$ count to data subcarriers with regard to the non-legacy header fields 2511 and 2513, and maps payload data 2522 in increments of an $R_{CB} \times N_D$ count to data subcarriers with regard to data fields 2510, 2512, and 2514. The IFFT unit 2710 converts the non-legacy header 2521 or payload data 2522 subjected to subcarrier mapping at the frequency region into time region signals by IFFT processing of $R_{CB} \times 512$ points. The GI insertion unit 2010 copies the last $R_{CB} \times N_{GI}$ samples of the output signals from the IFFT unit 2710 (GI 2523), and connects to the start of IFFT output signals, thereby generating OFDM symbols. Note that the order of the modulator 2707 and the duplicating unit 2708 may be reversed.

According to the present second embodiment, the non-legacy header fields and the data fields are transmitted by the same channel bandwidth using OFDM modulation, with the exception of the MF OFDM PPDU disposed at the start, so adding of a GI 2523 to the end of the non-legacy header field 2521 can be omitted, and rate conversion processing at the boundary between the non-legacy header field and data field becomes unnecessary, so consumption of electric power can be reduced.

Third Embodiment

In NG60 WiGig, the GI period of the SC block in the data field of an MF SC PPDU, or the GI period of OFDM symbols in the data field of an MF OFDM PPDU, can be changed to short, normal, or long, by changing the settings of the GI Length field in the non-legacy header illustrated in FIG. 10. In a third embodiment of the present disclosure, a method for generating an SC block for a non-legacy header field in a case of changing the GI period will be described with regard to the MF SC A-PPDU 2000 according to the first embodiment, illustrated in FIG. 20.

In the present embodiment, when changing the GI period in the MF SC A-PPDU 2000, the GI Length of the non-legacy header field 2007 of the MF SC PPDU 2001 disposed at the start is set to a desired value. Changing of the GI Length is applied to the data field in a conventional MF SC PPDU, but in the third embodiment of the present disclosure, this is also applied to all fields from the data field 2010 of the MF SC PPDU 2001 disposed at the start of the MF SC A-PPDU 2000 and thereafter. That is to say, the change of the GI period is also applied to the non-legacy header fields (2011, 2013) of the MF SC PPDUs (2002, 2003) disposed at the second sequential order and thereafter.

Accordingly, The GI Length fields of the non-legacy header fields 2011 and 2013 of the MF SC PPDUs 2002 and 2003 disposed at the second sequential order and thereafter are set to the same value as the GI Length field of the non-legacy header field 2007 of the MF SC PPDU 2001 disposed at the start. Note that the GI period of non-legacy header field 2007 of the MF SC PPDU 2001 disposed at the start is normal regardless of the settings of the GI Length field, and is unchanged.

Figure 28:
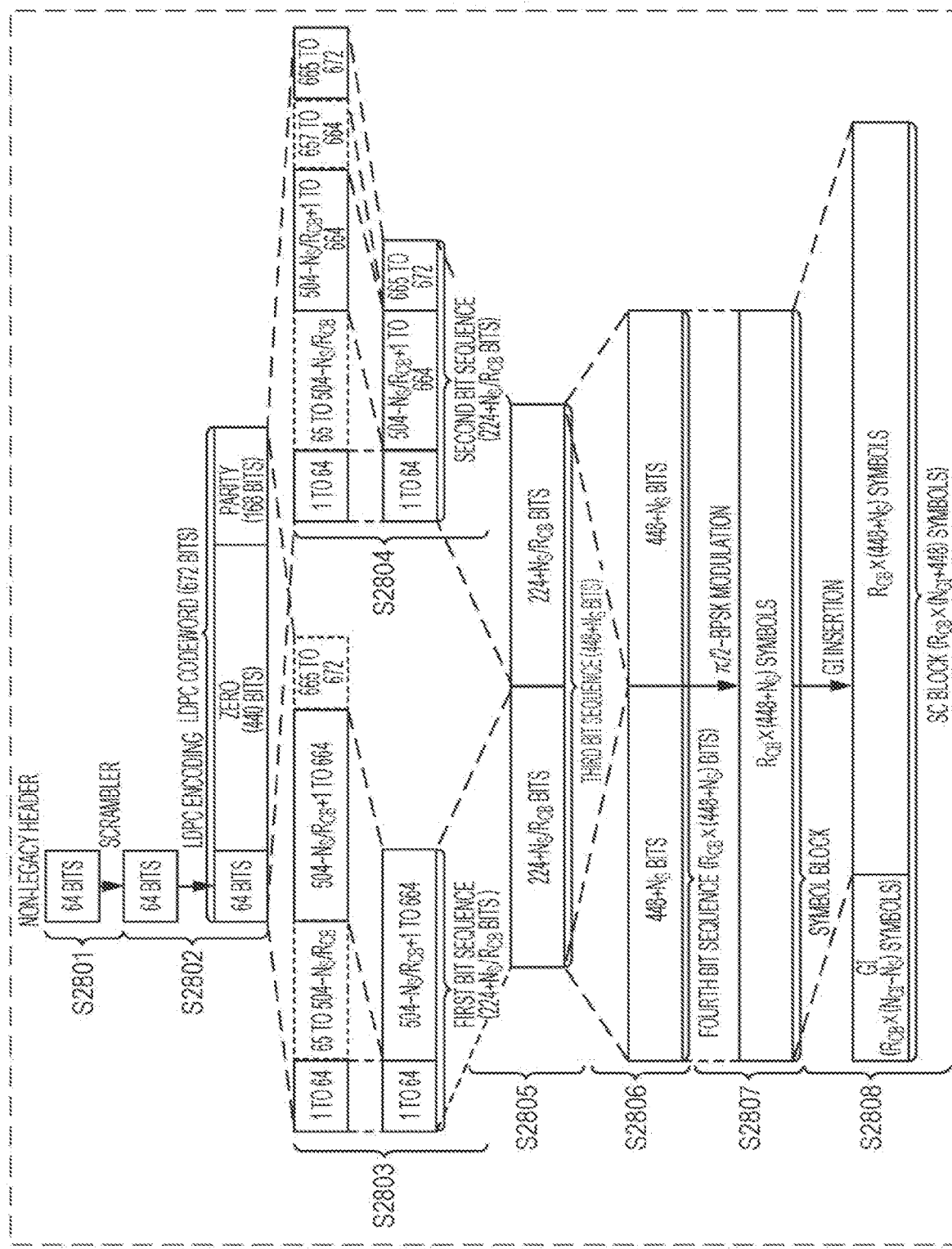
FIG. 28 is a diagram illustrating an example of a method for generating an SC block in a non-legacy header field of an MF SC A-PPDU in a case where a GI period has been changed, according to a third embodiment of the present disclosure.

A method of generating an SC block of a non-legacy header field in an MF SC PPDU disposed at the second sequential order and thereafter in a case where the GI period has been changed to a short GI will be described below with reference to FIG. 28. An example will be described here where the size of the non-legacy header is 64 bits, in a case where transmission is performed at the variable channel bandwidth of $R_{CB}=2$. Also, the symbol count of a short GI is a count that is $N_S$ symbols less than a normal GI.

(Step S2801) A 64-bit non-legacy header is scrambled, and 64 bits of scrambler output signals are obtained.

(Step S2802) 440 (i.e., 504-64) bits of 0 s are added to the end of the 64 bits of scrambler output signals, and an LDPC codeword that has a codelength of 672 bits is obtained by ¾ code rate LDPC encoding.

(Step S2803) The $440-N_S/R_{CB}$ bits of bits 65 through 504, and the eight bits of bits 665 through 672, are deleted from the LDPC codeword, thereby obtaining a first bit sequence of $224+N_S/R_{CB}$.

(Step S2804) The $440-N_S/R_{CB}$ bits of bits 65 through 504, and the eight bits of bits 657 through 664, are deleted from the LDPC codeword, thereby obtaining a reserve bit sequence of $224+N_S/R_{CB}$. Further, the XOR is computed for a PN (Pseudo random Noise) sequence obtained by initializing the shift register of the scrambler used in step S2801 to all 1 s and the reserve bit sequence, thereby obtaining a second bit sequence of $224+N_S/R_{CB}$.

(Step S2805) The first bit sequence and the second bit sequence are linked, thereby obtaining a third bit sequence of $448+N_S$.

(Step S2806) An $R_{CB}$ count of third bit sequence are linked, thereby obtaining a fourth bit sequence of $R_{CB} \times (448+N_S)$ bits.

(Step S2807) The fourth bit sequence is subjected to π/2-BPSK modulation, thereby obtaining a symbol block of $R_{CB} \times (448+N_S)$ symbols.

(Step S2808) A GI of $R_{CB} \times (N_{GI}-N_S)$ symbols is added to the start of the symbol block, thereby obtaining an SC block of $R_{CB} \times (N_{GI}+448)$ symbols. Note that the order of step S2807 and step S2808 may be reversed.

Note that in a case of changing a GI period to a long GI, the $N_S$ in step S2801 through step S2808 should be read as $-N_L$, since a long GI has $N_L$ more symbols than a normal GI.

According to the third embodiment of the present disclosure, the GI period and non-legacy header period in the SC block can be changed in accordance with the settings of the GI Length field settings of the non-legacy header, so transmission path situations can be flexibly handled.

Various forms of embodiments according to the present disclosure include the following.

A transmission device according to a first disclosure includes: a signal processing circuit that generates an aggregate physical layer convergence protocol data unit (A-PPDU) by adding a guard interval to each of a first part of a first physical layer convergence protocol data unit (PPDU) transmitted over each of a first through L'th channel of a predetermined channel bandwidth, where L is an integer of 2 or greater, a second part of the first PPDU transmitted over each of an (L+1)'th through P'th channel, which is a variable channel bandwidth that is N times the predetermined channel bandwidth, where N is an integer of 2 or greater and P is an integer of L+1 or greater, and a second PPDU transmitted over the (L+1)'th through P'th channel; and a wireless circuit that transmits the A-PPDU. The first PPDU includes a legacy STF, a legacy CEF, a legacy header field, a non-legacy STF, a non-legacy CEF, one or more non-legacy header fields including one or more non-legacy headers, and one or more data fields including one or more payload data. The first part of the first PPDU includes the legacy STF, the legacy CEF, the legacy header field, and the non-legacy header field. The second part of the first PPDU includes the non-legacy STF, the non-legacy CEF, and the one or more data fields. The second PPDU includes the one or more non-legacy header fields and the one or more data fields. In a case where the wireless circuit transmits the first PPDU and the second PPDU by single carrier, each of the one or more non-legacy header fields of the second PPDU includes a non-legacy header that has been repeated N times.

A transmission device according to a second disclosure is the transmission device according to the first disclosure, wherein the signal processing unit adds the guard interval of $N_{GI}$ symbols (where $N_{GI}$ is an integer of 1 or greater) to the non-legacy header of $N_{NLH}$ symbols (where $N_{NLH}$ is an integer of 1 or greater), included in the one or more non-legacy header fields in the first part of the first PPDU, and adds the guard interval of $(N_{GI}+M) \times N$ symbols (where M is an integer of 0 or greater) to the non-legacy header of $N_{NLH}-M$ symbols, and adds the guard interval of $(N_{GI}-M) \times N$ symbols to the non-legacy header of $N_{NLH} \times M$ symbols, included in the non-legacy header field in the second PPDU.

A transmission method according to a third disclosure includes: generating an aggregate physical layer convergence protocol data unit (A-PPDU) by adding a guard interval to each of a first part of a first physical layer convergence protocol data unit (PPDU) transmitted over each of a first through L'th channel of a predetermined channel bandwidth, where L is an integer of 2 or greater, a second part of the first PPDU transmitted over each of an (L+1)'th through P'th channel, which is a variable channel bandwidth that is N times the predetermined channel bandwidth, and a second PPDU transmitted over the (L+1)'th through P'th channel; and transmitting the A-PPDU. The first PPDU includes a legacy STF, a legacy CEF, a legacy header field, a non-legacy STF, a non-legacy CEF, one or more non-legacy header fields including one or more non-legacy headers, and one or more data fields including one or more payload data. The first part of the first PPDU includes the legacy STF, the legacy CEF, the legacy header field, and the non-legacy header field. The second part of the first PPDU includes the non-legacy STF, the non-legacy CEF, and the one or more data fields. The second PPDU includes the one or more non-legacy header fields and the one or more data fields. In a case of transmitting the first PPDU and the second PPDU by single carrier, each of the one or more non-legacy header fields of the second PPDU includes a non-legacy header that has been repeated N times.

A transmission method according to a fourth aspect is the transmission device according to the third aspect, wherein the guard interval of $N_{GI}$ symbols (where $N_{GI}$ is an integer of 1 or greater) is added to the non-legacy header of $N_{NLH}$ symbols (where $N_{NLH}$ is an integer of 1 or greater), included in the one or more non-legacy header fields in the first part of the first PPDU, and wherein the guard interval of $(N_{GI}+M) \times N$ symbols (where M is an integer of 0 or greater) is added to the non-legacy header of $N_{NLH}-M$ symbols, and the guard interval of $(N_{GI}-M) \times N$ symbols is added to the non-legacy header of $N_{NLH}+M$ symbols, included in the non-legacy header field in the second PPDU.

Although various embodiments have been described above with reference to the drawings, it is needless to say that the present disclosure is not restricted to these examples. It is clear that one skilled in the art will be able to reach various alterations and modifications within the scope of the Claims, and such should be understood to belong to the technical scope of the present disclosure as a matter of course. Various components in the above-described embodiments may be optionally combined without departing from the essence of the disclosure.

Although examples of configuring the present disclosure using hardware have been described in the above-described embodiments, the present disclosure may be realized by software in cooperation with hardware as well.

The functional blocks used in the description of the above-described embodiments typically are realized as large scale integration (LSI) that is an integrated circuit having input terminals and output terminals. These may be individually formed into one chip, or part or all may be included in one chip. Also, while description has been made regarding an LSI, there are different names such as IC, system LSI, super LSI, and ultra LSI, depending on the degree of integration.

The circuit integration technique is not restricted to LSIs, and dedicated circuits or general-purpose processors may be used to realize the same. An field programmable gate array (FPGA) which can be programmed after manufacturing the LSI, or a reconfigurable processor where circuit cell connections and settings within the LSI can be reconfigured, may be used.

Further, in the event of the advent of an integrated circuit technology which would replace LSIs by advance of semiconductor technology or a separate technology derived therefrom, such a technology may be used for integration of the functional blocks, as a matter of course. Application of biotechnology, for example, is a possibility.

The present disclosure is applicable to a method of configuring and transmitting A-PPDUs in a wireless communication system including a cellular device, smartphone, tablet terminal, and television terminal, that transmits and receives moving images (video), still images (pictures) text data, audio data, and control data.

What is claimed is:

1. A reception apparatus, comprising:
 a receiver, which, in operation, receives an aggregate physical layer convergence protocol data unit (A-PPDU) including a first PPDU and a second PPDU, the first PPDU including a first portion and a second portion, wherein
 the first portion of the first PPDU is duplicated in a frequency axis direction and transmitted on a primary channel and a secondary channel, each of the primary channel and the secondary channel having a standard channel bandwidth,
 the second portion of the first PPDU is transmitted using a variable channel bandwidth that is N times the standard channel bandwidth, where N is an integer of 2 or greater,
 the second PPDU includes a non-legacy header field and a data field, the second PPDU being transmitted using the variable channel bandwidth; and
 a reception processor, which is coupled to the receiver and which, in operation, performs a reception process on the received A-PPDU, wherein in a case where the received A-PPDU is transmitted by a single carrier, the second PPDU includes N repetitions of data blocks, which consist of original data blocks and N−1 duplications of the original data blocks, in the non-legacy header field.

2. The reception apparatus according to claim 1, wherein
 a guard interval is added to each of the first portion of the first PPDU, the second portion of the first PPDU, and the second PPDU.

3. The reception apparatus according to claim 1, wherein
 the first portion of the first PPDU includes legacy preamble fields, a legacy header field, and a non-legacy header field; and
 the second portion of the first PPDU includes non-legacy preamble fields.

4. The reception apparatus according to claim 3, wherein
 in a case where the second PPDU is transmitted by multicarrier,
 the non-legacy header field in the first portion of the first PPDU is transmitted by a single carrier using the standard channel bandwidth; and
 the data field in the second PPDU is transmitted by multicarrier using the variable channel bandwidth.

5. A reception method, comprising:
receiving an aggregate physical layer convergence protocol data unit (A-PPDU) including a first PPDU and a second PPDU, the first PPDU including a first portion and a second portion, wherein
the first portion of the first PPDU is duplicated in a frequency axis direction and transmitted on a primary channel and a secondary channel, each of the primary channel and the secondary channel having a standard channel bandwidth,
the second portion of the first PPDU is transmitted using a variable channel bandwidth that is N times the standard channel bandwidth, where N is an integer of 2 or greater,
the second PPDU includes a non-legacy header field and a data field, the second PPDU being transmitted using the variable channel bandwidth; and
performing a reception process on the received A-PPDU, wherein in a case where the received A-PPDU is transmitted by a single carrier, the second PPDU includes N repetitions of data blocks, which consist of original data blocks and N−1 duplications of the original data blocks, in the non-legacy header field.

6. The reception method according to claim 5, wherein
a guard interval is added to each of the first portion of the first PPDU, the second portion of the first PPDU, and the second PPDU.

7. The reception method according to claim 5, wherein
the first portion of the first PPDU includes legacy preamble fields, a legacy header field, and a non-legacy header field; and
the second portion of the first PPDU includes non-legacy preamble fields.

8. The reception method according to claim 7, wherein
in a case where the second PPDU is transmitted by multicarrier,
the non-legacy header field in the first portion of the first PPDU is transmitted by a single carrier using the standard channel bandwidth; and
the data field in the second PPDU is transmitted by multicarrier using the variable channel bandwidth.

* * * * *